United States Patent
Wen et al.

(10) Patent No.: US 12,354,520 B2
(45) Date of Patent: Jul. 8, 2025

(54) DISPLAY PANEL, DISPLAY DEVICE AND METHOD OF CONTROLLING DISPLAY PANEL

(71) Applicants: BEIJING BOE DISPLAY TECHNOLOGY CO., LTD., Beijing (CN); BOE TECHNOLOGY GROUP CO., LTD., Beijing (CN)

(72) Inventors: Na Wen, Beijing (CN); Jiabin Zou, Beijing (CN); Xiaofeng Yin, Beijing (CN); Yan Yan, Beijing (CN); Feng Li, Beijing (CN); Cuicui Zheng, Beijing (CN); Qi Sang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/262,357

(22) PCT Filed: Aug. 23, 2022

(86) PCT No.: PCT/CN2022/114229
§ 371 (c)(1),
(2) Date: Jul. 20, 2023

(87) PCT Pub. No.: WO2024/040432
PCT Pub. Date: Feb. 29, 2024

(65) Prior Publication Data
US 2024/0404450 A1 Dec. 5, 2024

(51) Int. Cl.
*G09G 3/20* (2006.01)
*G11C 19/28* (2006.01)

(52) U.S. Cl.
CPC .......... *G09G 3/2092* (2013.01); *G11C 19/28* (2013.01); *G09G 2310/0267* (2013.01); *G09G 2310/0286* (2013.01); *G09G 2310/08* (2013.01)

(58) Field of Classification Search
CPC ......... G09G 3/2092; G09G 2310/0267; G09G 2310/2086; G09G 2310/08; G09G 3/3677; G09G 3/3655; G11C 19/28
See application file for complete search history.

(56) References Cited

U.S. PATENT DOCUMENTS 11,308,912 B2  4/2022  Cheng et al.
11,676,524 B2  6/2023  Xie et al.
(Continued)

FOREIGN PATENT DOCUMENTS

CN   103280201 B  *  9/2015  ........... G09G 3/3677
CN   111883074 A     11/2020
(Continued)

OTHER PUBLICATIONS

International Search Report dated May 4, 2023, for corresponding PCT Application No. PCT/CN2022/114229.

*Primary Examiner* — Benjamin C Lee
*Assistant Examiner* — Emily J Frank
(74) *Attorney, Agent, or Firm* — Kinney & Lange, P.A.

(57) ABSTRACT

A display panel, a display device and a method of controlling a display panel are provided. The display panel includes a base substrate, a plurality of sub-pixels, a plurality of gate lines each gate line being connected to at least one row of sub-pixels, a plurality of shift registers, and a plurality of auxiliary circuits located in a peripheral region of the base substrate. The gate line has a first end connected to the shift register and a second end connected to the auxiliary circuit. The auxiliary circuit has a control terminal configured to receive an auxiliary signal, an input terminal configured to (Continued)

receive a reference signal, and an output terminal connected to the second end of the gate line, and is configured to provide the reference signal at the input terminal to the output terminal under control of the auxiliary signal at the control terminal.

16 Claims, 13 Drawing Sheets

(56) References Cited

U.S. PATENT DOCUMENTS

| | | |
|---|---|---|
| 11,699,410 B2 | 7/2023 | Liu |
| 2012/0032615 A1* | 2/2012 | Kikuchi ............... G09G 3/3677 |
| | | 377/67 |
| 2019/0279589 A1* | 9/2019 | Kusumi ............... G09G 3/3677 |
| 2020/0258436 A1 | 8/2020 | Tsai et al. |
| 2022/0036847 A1 | 2/2022 | Cheng et al. |
| 2022/0036849 A1* | 2/2022 | Cheng ............... G02F 1/136286 |
| 2022/0398968 A1 | 12/2022 | Wang et al. |
| 2022/0398991 A1 | 12/2022 | Liu |
| 2023/0043196 A1 | 2/2023 | Xie et al. |

FOREIGN PATENT DOCUMENTS

| | | |
|---|---|---|
| CN | 111883077 A | 11/2020 |
| CN | 112164365 A | 1/2021 |
| CN | 112669782 A | 4/2021 |
| JP | 2009015334 A | 1/2009 |
| WO | 2020015138 A1 | 1/2020 |
| WO | 2022133729 A1 | 6/2022 |

* cited by examiner

| M2 (μm) | 4900 | 4900 | 9000 | 9000 |
|---|---|---|---|---|
| M1 (μm) | 3200 | - | 3200 | - |
| Near Tf (μs) | 3.361 | 4.056 | 3.014 | 3.376 |
| Far Tf (μs) | 3.227 | 4.547 | 2.921 | 3.892 |

| M2 (μm) | 4900 | 4900 | 4900 | 4900 |
|---|---|---|---|---|
| M1 (μm) | 1000 | 2000 | 3000 | 4000 |
| Near Tf (μs) | 3.679 | 3.493 | 3.38 | 3.294 |
| Far Tf (μs) | 3.832 | 3.464 | 3.26 | 3.119 |

| M2 (μm) | 5000 | 5500 | 6000 | 6500 | 7000 |
|---|---|---|---|---|---|
| M1 (μm) | 3000 | 2500 | 2000 | 1500 | 1000 |
| Near Tf (μs) | 3.359 | 3.326 | 3.304 | 3.337 | 3.367 |
| Far Tf (μs) | 3.245 | 3.265 | 3.305 | 3.368 | 3.504 |

# DISPLAY PANEL, DISPLAY DEVICE AND METHOD OF CONTROLLING DISPLAY PANEL

CROSS REFERENCE TO RELATED APPLICATION(S)

This application is a Section 371 National Stage Application of International Application No. PCT/CN2022/114229, filed on Aug. 23, 2022, entitled "DISPLAY PANEL, DISPLAY DEVICE AND METHOD OF CONTROLLING DISPLAY PANEL", which is incorporated herein in entirety by reference.

TECHNICAL FIELD

The present disclosure relates to a field of display technology, in particular to a display panel, a display device and a method of controlling a display panel.

BACKGROUND

The display panel is usually provided with a plurality of sub-pixels, a plurality of gate lines and a gate driving circuit. The plurality of sub-pixels may receive scanning signals provided by the gate driving circuit through the plurality of gate lines. However, with a development of technology, requirements for display quality of the display panel are becoming increasingly high, and current display panel designs may not meet requirements of high-quality display.

SUMMARY

Embodiments of the present disclosure provide a display panel, a display device and a method of controlling a display panel.

According to an aspect of the present disclosure, there is provided a display panel, including:
 a base substrate, the base substrate including a display region and a peripheral region surrounding the display region;
 a plurality of sub-pixels located in the display region and arranged in a plurality of rows along a first direction;
 a plurality of gate lines located in the display region, wherein the plurality of gate lines extend along the first direction and are arranged along a second direction intersecting with the first direction, and each gate line is connected to at least one row of sub-pixels;
 a plurality of shift registers located in the peripheral region and configured to provide scanning signals; and
 a plurality of auxiliary circuits located in the peripheral region, wherein a first end of at least one gate line is connected to at least one of the plurality of shift registers and configured to receive the scanning signal provided by the at least one of the plurality of shift registers, and a second end of the at least one gate line is connected to at least one of the plurality of auxiliary circuits, wherein a control terminal of the auxiliary circuit is configured to receive an auxiliary signal, an input terminal of the auxiliary circuit is configured to receive a reference signal, an output terminal of the auxiliary circuit is connected to the second end of the gate line, and the auxiliary circuit is configured to provide the reference signal at the input terminal of the auxiliary circuit to the output terminal of the auxiliary circuit under control of the auxiliary signal.

For example, the control terminal of the auxiliary circuit connected to an $i^{th}$ gate line among the plurality of gate lines is connected to receive, as the auxiliary signal, the scanning signal provided by the shift register connected to an $(i+k)^{th}$ gate line, where each of $i^{th}$ and k is an integer greater than or equal to 1.

For example, the plurality of shift registers include a plurality of first shift registers, which are located on a first side of the display region along the first direction and are cascaded;
 the plurality of auxiliary circuits include a plurality of first auxiliary circuits located on a second side of the display region opposite to the first side of the display region along the first direction;
 the at least one gate line includes a plurality of first gate lines, a first end of the first gate line is located on the first side of the display region and connected to the first shift register, and a second end of the first gate line is located on the second side of the display region and connected to the first auxiliary circuit.

For example, a control terminal of an $i^{th}$ first auxiliary circuit is connected to a second end of an $(i+k)^{th}$ first gate line, and an output terminal of the $i^{th}$ first auxiliary circuit is connected to a second end of an $i^{th}$ first gate line.

For example, the plurality of shift registers further include a plurality of second shift registers, which are located on the second side of the display region and are cascaded;
 the plurality of auxiliary circuits further include a plurality of second auxiliary circuits located on the first side of the display region; and
 the at least one gate line further includes a plurality of second gate lines alternated with the plurality of first gate lines, a first end of the second gate line is located on the second side of the display region and connected to the second shift register, and a second end of the second gate line is located on the first side of the display region and connected to the second auxiliary circuit.

For example, the first gate line is connected to an odd numbered row of sub-pixels, and the second gate line is connected to an even numbered row of sub-pixels.

For example, k=4, a control terminal of the first auxiliary circuit connected to each first gate line is connected to an output signal terminal of the second shift register connected to the second gate line, which is spaced from the first gate line by three of the plurality of gate lines; and a control terminal of the second auxiliary circuit connected to each second gate line is connected to an output signal terminal of the first shift register connected to the first gate line, which is spaced from the second gate line by three of the plurality of gate lines.

For example, the first auxiliary circuit is located between the display region and the second shift register, and the second auxiliary circuit is located between the display region and the first shift register.

For example, a size of the first auxiliary circuit in the second direction is equal to a sum of sizes of two rows of sub-pixels in the second direction, and a size of the second auxiliary circuit in the second direction is equal to the sum of sizes of two rows of sub-pixels in the second direction.

For example, the plurality of shift registers further include a plurality of third shift registers located on the second side of the display region;
 the plurality of auxiliary circuits further include a plurality of third auxiliary circuits located on the first side of the display region; and the first end of the first gate line is further connected to the third auxiliary circuit, and the second end of the first gate line is further connected to the third shift register.

For example, the first auxiliary circuit is located between the display region and the third shift register, and the third auxiliary circuit is located between the display region and the first shift register.

For example, a control terminal of an $i^{th}$ first auxiliary circuit is connected to an output signal terminal of an $(i+k)^{th}$ stage of third shift register, and an output terminal of an $i^{th}$ first auxiliary circuit is connected to a second end of an $i^{th}$ first gate line;

a control terminal of an $i^{th}$ third auxiliary circuit is connected to an output signal terminal of an $(i+k)^{th}$ stage of first shift register, and an output terminal of the $i^{th}$ third auxiliary circuit is connected to a first end of the $i^{th}$ first gate line.

For example, the auxiliary circuit includes a first transistor, wherein a gate of the first transistor is implemented as the control terminal of the auxiliary circuit, a first electrode of the first transistor is implemented as the input terminal of the auxiliary circuit, and a second electrode of the first transistor is implemented as the output terminal of the auxiliary circuit.

For example, the shift register includes:

an input circuit connected to an input signal terminal of the shift register and a pull-up node of the shift register, and configured to provide a signal from the input signal terminal to the pull-up node;

an output circuit connected to the pull-up node, a clock signal terminal of the shift register and an output signal terminal of the shift register, and configured to provide a signal from the clock signal terminal to the output signal terminal under control of the pull-up node, so as to output the scanning signal;

a control circuit connected to the pull-up node of the shift register and a pull-down node of the shift register, and configured to control a potential of the pull-down node based on a potential of the pull-up node; and a pull-down circuit connected to the output signal terminal of the shift register and the pull-down node, and configured to pull down a potential of the output signal terminal of the shift register under control of the pull-down node.

For example, the output circuit includes:

a second transistor, wherein a gate of the second transistor is connected to the pull-up node, a first electrode of the second transistor is connected to the clock signal terminal, and a second electrode of the second transistor is connected to the output signal terminal of the shift register; and a capacitor, wherein a first electrode of the capacitor is connected to the pull-up node, and a second electrode of the capacitor is connected to the output signal terminal of the shift register.

For example, the auxiliary circuit includes a first transistor, wherein a gate of the first transistor is implemented as the control terminal of the auxiliary circuit, a first electrode of the first transistor is implemented as the input terminal of the auxiliary circuit, and a second electrode of the first transistor is implemented as the output terminal of the auxiliary circuit; and the first transistor is a thin film transistor, a channel width of the first transistor is in a range of 1000 μm to 3000 μm, the second transistor is a thin film transistor, a channel width of the second transistor is in a range of 5000 μm to 7000 μm, and a channel length of each of the first transistor and the second transistor is in a range of 3 μm to 6 μm.

For example, the shift register further includes a reset circuit, wherein the reset circuit is connected to the pull-up node and a reset signal terminal of the shift register, and configured to reset the pull-up node under control of the reset signal terminal.

According to another aspect of the present disclosure, there is further provided a display device, including the display panel described above.

According to another aspect of the present disclosure, there is further provided a method of controlling a display device, including respectively providing scanning signals to a plurality of rows of sub-pixels by a plurality of shift registers during a plurality of scanning periods, wherein each scanning period includes a first period and a second period, wherein, in the first period, at least one of the plurality of shift registers provides a scanning signal to at least one row of sub-pixels among the plurality of sub-pixels through at least one gate line; and in the second period, at least one of the plurality of auxiliary circuits provides a reference signal to the gate line under control of an auxiliary signal.

DETAILED DESCRIPTION OF EMBODIMENTS

Although the present disclosure will be fully described with reference to the accompanying drawings containing preferred embodiments of the present disclosure, it should be understood that those of ordinary skill in the art may modify the present disclosure described herein, and at the same time obtain technical effects of the present disclosure.

Therefore, it is important to understand that the above description is a broad disclosure for those of ordinary skill in the art, and its content is not intended to limit exemplary embodiments described in the present disclosure.

In addition, in the detailed description below, many specific details have been elaborated to provide a comprehensive understanding of the embodiments of the present disclosure for ease of explanation. However, it is apparent that one or more embodiments may also be implemented without these specific details. In other cases, well-known structures and devices are illustrated to simplify the accompanying drawings.

In a display panel, a gate driving circuit is usually connected to an end of a gate line, which is referred to as a near end in the present disclosure, so as to apply a scanning signal to the near end. An end of the gate line opposite to the near end of the gate line is referred to as a far end in the present disclosure. In practice, a signal at the far end of the gate line is influenced by various factors, such as lengths and electrical characteristics (such as a resistance, a capacitance, etc.) of the gate line, a size of a screen, etc., which leads to a certain difference between the signal at the far end of the gate line and a signal at the near end of the gate line. Especially for a horizontal screen with long gate lines (i.e. a display panel having a horizontal size greater than a vertical size), there is a significant difference between a signal delay at the near end of the gate line and a signal delay at the far end of the gate line.

Figure 1:
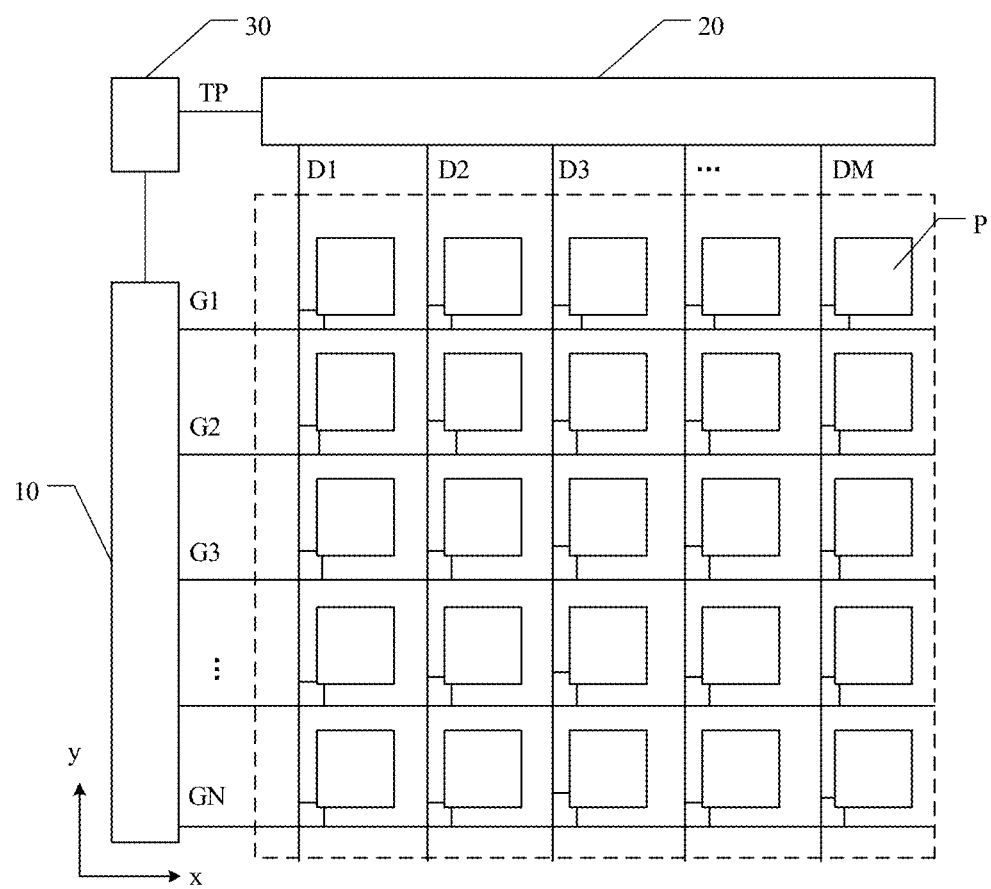
FIG. 1 shows a schematic diagram of a display panel according to an embodiment of the present disclosure.

FIG. 1 shows a schematic diagram of a display panel according to an embodiment of the present disclosure.

As shown in FIG. 1, the display panel includes a plurality of sub-pixels P, and the plurality of sub-pixels P are arranged in a plurality of rows, such as an N×M array, where each of N and M is an integer greater than 1.

The display panel may also include a gate driving circuit 10, and the gate driving circuit 10 is connected to the plurality of sub-pixels P. The gate driving circuit 10 may be respectively connected to N rows of sub-pixels through a plurality of gate lines G1, G2, . . . , GN extending along a first direction (x direction in FIG. 1). For example, The gate driving circuit 10 may be connected to a first row of sub-pixels P through the gate line G1 to provide a scanning signal to the first row of sub-pixels P, to a second row of sub-pixels P through the gate line G2 to provide a scanning signal to the second row of sub-pixels P, and so on. The first row of sub-pixels P are turned on in response to the scanning signal of the gate line G1, the second row of sub-pixels P are turned on in response to the scanning signal of the gate line G2, and so on.

Figure 2:
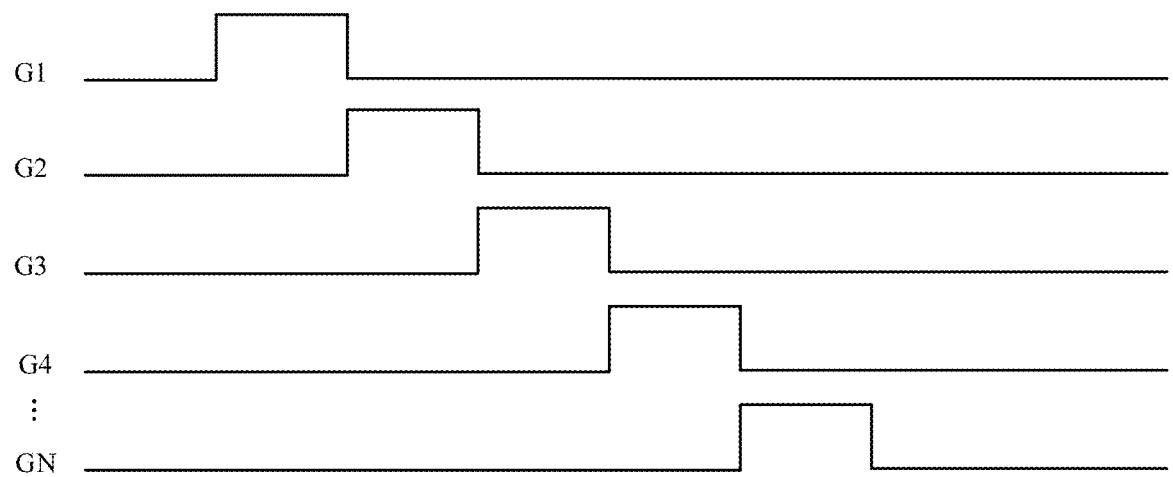
FIG. 2 shows a timing diagram of scanning signals according to an embodiment of the present disclosure.

In some embodiments, the gate driving circuit 10 may scan N rows of sub-pixels P in sequence with one or more rows being scanned in each scanning. For example, as shown in FIG. 2, the gate driving circuit 10 may respectively apply N sequentially shifted scanning signals to the gate lines G1, G2, . . . , GN, to sequentially turn on the first row of sub-pixels P, the second row of sub-pixels P, . . . , and the $N^{th}$ row of sub-pixels P. In some embodiments, the gate driving circuit 10 may sequentially scan each row of sub-pixels from the last row to the first row, for example, apply the scanning signals to N gate lines in an order of GN, G (N-1), . . . , G1. As another example, the gate driving circuit 10 may scan two or more rows of sub-pixels P at a time. For example, the gate driving circuit 10 may simultaneously apply the scanning signals to the gate lines G1 and G2 to simultaneously turn on the first row of sub-pixels P and the second row of sub-pixels P, then the gate driving circuit 10 may simultaneously apply scanning signals to the gate lines G3 and G4 to simultaneously turn on the third row of sub-pixels P and the fourth row of sub-pixels P, and so on. In some embodiments, the gate driving circuit 10 may scan the N rows of sub-pixels P at an interval of at least one row of sub-pixels P to sequentially turn on some of the N rows of sub-pixels P. For example, the gate driving circuit 10 may sequentially scan odd numbered rows of sub-pixels P (such as sequentially turn on the first row of sub-pixels P, the third row of sub-pixels P, the fifth row of sub-pixels P, and so on), or sequentially scan even numbered rows of sub-pixels P (such as sequentially turn on the second row of sub-pixels P, the fourth row of sub-pixels P, the sixth row of sub-pixels P, and so on).

The display panel may also include a source driving circuit 20, and the source driving circuit 20 is connected to the plurality of sub-pixels P. For example, the source driving circuit 20 may be respectively connected to M columns of sub-pixels P through the plurality of data lines extending along a second direction (y direction in FIG. 1). For example, the source driving circuit 20 may be connected to a first column of sub-pixels P through a first data line to provide a first data signal D1 to the first column of sub-pixels P, connected to a second column sub-pixels P through a second data line to provide a second data signal D2 to a second column of sub-pixels P, and so on.

For example, when the first row of sub-pixels P are turned on, the source driving circuit 20 may respectively provide M data signals D11, D12, . . . , D1M for the first row of sub-pixels to the M sub-pixels P in the first row through M data lines. When the second row of sub-pixels P are turned on, the source driving circuit 20 may respectively provide M data signals D21, D22, . . . , D2M for the second row to the M sub-pixels P in the second row through the plurality of data lines, and so on. Certainly, embodiments of the present disclosure are not limited to thereto, which will be further described in detail below.

In some embodiments, the display panel may also include a timing controller 30, and the timing controller 30 is connected to the gate driving circuit 10 and the source driving circuit 20. The timing controller 30 may provide relevant control signals to the gate driving circuit 10 and the source driving circuit 20. For example, the timing controller 30 may provide a data control signal TP to the source driving circuit 20, and the source driving circuit 20 may output data signals for each row under control of the data control signal TP. The timing controller 30 may also provide other control signals to the source driving circuit 20, including but not limited to a row data starting signal, a data synchronization signal, a data inversion signal and the like. The timing controller 30 may also provide various control signals to the gate driving circuit 10, including but not limited to a start-up signal, a clock signal and the like, which are required by the gate driving circuit 10.

Figure 3:
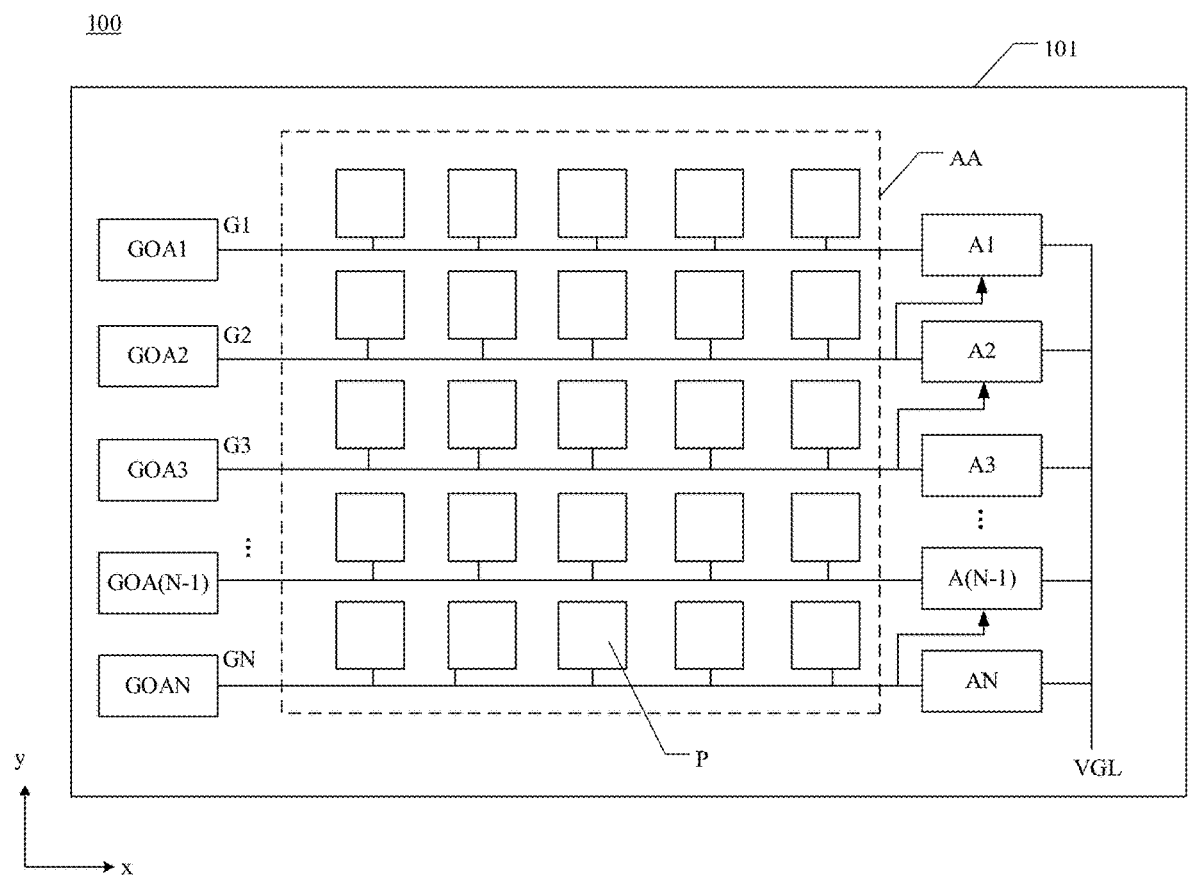
FIG. 3 shows a schematic diagram of a display panel according to an embodiment of the present disclosure.

FIG. 3 shows a schematic diagram of a display panel according to an embodiment of the present disclosure.

As shown in FIG. 3, the display panel 100 includes a base substrate 101. The base substrate 100 includes a display region AA and a peripheral region surrounding the display region. A plurality of sub-pixels P are located in the display region AA and arranged in a plurality of rows along a first direction (x direction in FIG. 3).

A plurality of gate lines G1, G2, . . . , GN are located in the display region AA. The plurality of gate lines G1, G2, . . . , GN extend in the first direction and are arranged in a second direction (y direction in FIG. 3) intersecting with the first direction. Each gate line G1, G2, . . . , GN is connected to at least one row of sub-pixels P. For example, in FIG. 3, the plurality of gate lines are connected to the plurality of rows of sub-pixels in one-to-one correspondence, that is the gate line G1 is connected to the first row of sub-pixels P, and the gate line G2 is connected to the second row of sub-pixels P. However, embodiments of the present disclosure are not limited to thereto. In some embodiments, one gate line may be connected to a plurality of rows of sub-pixels, or a plurality of gate lines may be connected to one row of sub-pixels. The present disclosure does not limit this.

A plurality of shift registers GOA1, GOA2, . . . , GOAN are located in the peripheral region and respectively connected to the plurality of gate lines G1, G2, . . . , GN to provide scanning signals, e.g. the scanning signals as shown in FIG. 2, to these gate lines. Certainly, the embodiments of the present disclosure are not limited to thereto. A timing of the scanning signal may be set as required, and the present disclosure does not limit this. In FIG. 3, the plurality of shift registers are connected to the plurality of gate lines in one-to-one correspondence, that is, the shift register GOA1 is connected to the gate line G1, the shift register GOA2 is connected to the gate line G2, and so on. However, the embodiments of the present disclosure are not limited to thereto. In some embodiments, one shift register may be connected to a plurality of gate lines, or one gate line may be connected to a plurality of shift registers. The present disclosure does not limit this.

A plurality of auxiliary circuits A1, A2, . . . , AN are located in the peripheral region. An end of at least one gate line is connected to at least one shift register to receive a scanning signal provided by the at least one shift register, and the other end of the at least one gate line is connected to at least one auxiliary circuit. In FIG. 3, two ends of each gate line are respectively connected to one shift register and one auxiliary circuit. For example, one end (left end in FIG. 3) of the gate line G1 is connected to the shift register GOA1 and the other end (right end in FIG. 3) of the gate line G1 is connected to the auxiliary circuit A1, one end of the gate line G1 is connected to the shift register GOA2 and the other end of the gate line G1 is connected to the auxiliary circuit A2, and so on. However, the embodiments of the present disclosure are not limited to thereto. The number of shift registers and auxiliary circuits connected to both ends of the gate line may be set as required, which will not be repeated here.

As shown in FIG. 3, a control terminal of each auxiliary circuit A1, A2, . . . , AN may be connected to receive a corresponding auxiliary signal (as shown by the arrow line). The auxiliary signal may be a separately provided auxiliary signal. Alternatively, a scanning signal provided by a next stage shift register may be taken as the auxiliary signal. In FIG. 3, the control terminal of the auxiliary circuit connected to an $i^{th}$ gate line is connected to receive the scanning signal provided by the shift register connected to an $(i+k)^{th}$ gate line as the auxiliary signal, where each of $i^{th}$ and k is an integer greater than or equal to 1. For example, in a case of k=1, the control terminal of the auxiliary circuit A1 connected to the first gate line G1 may receive a scanning signal provided by the shift register GOA2 connected to the second gate line G2 as the auxiliary signal, the control terminal of the auxiliary circuit A2 may receive a scanning signal provided by the shift register GOA3 as the auxiliary signal, and so on. Although the control terminal of the auxiliary circuit is shown in FIG. 3 as the gate line connected to a next row, this indicates only an electrical connection between the two, and does not have to be a physical connection. The control terminal of the auxiliary circuit may receive auxiliary signals provided by other shift registers in various ways, which will be described in detail below.

An input terminal of each auxiliary circuit A1, A2, . . . , AN is connected to receive a reference signal, for example, connected to a reference signal terminal VGL providing the reference signal. The output terminal of each auxiliary circuit A1, A2, . . . , AN is connected to the other end (right end in FIG. 3) of a corresponding gate line. The auxiliary circuits A1, A2, . . . , AN may provide reference signals at their respective input terminals to their respective output terminals under control of auxiliary signals at their respective control terminals. For example, the auxiliary circuit A1 may receive the scanning signal provided by the shift register GOA2 as the auxiliary signal, and provide the reference signal at the reference signal terminal VGL to a scanning line G1 under control of the auxiliary signal. Correspondingly, the auxiliary circuit A2 may receive the scanning signal provided by the shift register GOA3 as the auxiliary signal and provide the reference signal at the reference signal terminal VGL to the scanning line G2 under control of the auxiliary signal, and so on.

Although the above embodiments are illustrated by taking k=1 as an example, the embodiments of the present disclosure are not limited to thereto. A value of k may be set as required, for example, k may be 2 or other values.

Although a top row of sub-pixels along the y direction is taken as the first row of sub-pixels, and a bottom row of sub-pixels is taken as the last row of sub-pixels in FIG. 3, this is only for illustration. In the embodiments of the present disclosure, the so-called first row and the so-called last row are defined in an order of scanning. For example, a first scanned row is defined as the first row, and a last scanned row is defined as the last row. In some embodiments, respective rows of pixels may be scanned from bottom to top. In this case, the bottom row may be taken as the first row and the top row may be taken as the last row.

Although the shift registers are shown as being located on one side (left side) of the display region in FIG. 3, this is only for convenience of illustration. The shift registers may be distributed in other positions of the peripheral region as required, such as on both sides of the display region, which will be further described in detail below.

In some embodiments, the display panel may also include other components such as a source driver or a timing controller, etc., for example, the source driver and the timing controller, etc. described above with reference to FIG. 1, which will not be repeated here.

In the embodiments of the present disclosure, an end of the gate line connected to the shift register may be referred to as a near end of the gate line, and an end of the gate line opposite to the near end of the gate line may be referred to as a far end. In the embodiments of the present disclosure, since the auxiliary circuit is disposed at the far end of the gate line, an electrical potential at the far end of the gate line may be pulled down after the scanning signal has been output by the shift register at the near end of the gate line, for example, after the scanning signal starts to fall from a high level to a low level, so as to reduce a falling time of the signal at the far end of the gate line. The so-called falling time here refers to a time required for the signal to fall from a high level to a desired low level. Since an existence of the auxiliary circuit reduces the falling time of the signal at the far end of the gate line, a difference between the falling time of the signal at the far end of the gate line and the falling time of the signal at the near end of the gate line may be reduced, thereby improving the display quality.

Figure 4:
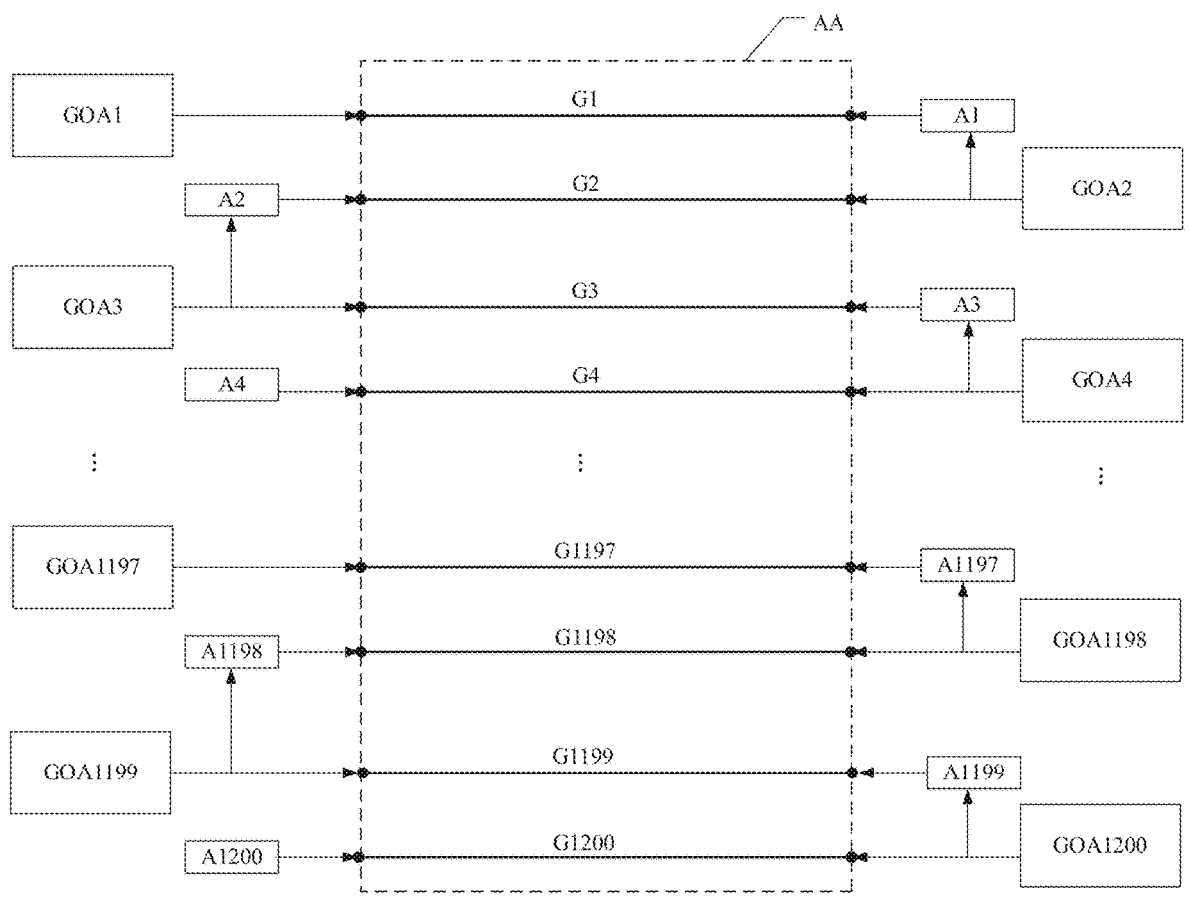
FIG. 4 shows a schematic diagram of a display panel according to another embodiment of the present disclosure.

FIG. 4 shows a schematic diagram of a display panel according to another embodiment of the present disclosure.

As shown in FIG. 4, the display panel 200 includes a plurality of sub-pixels P, a plurality of gate lines G1, G2, . . . , GN, a plurality of shift registers GOA1, GOA2, . . . , GOAN, and a plurality of auxiliary circuits A1, A2, . . . , AN, which are located on a base substrate. The above description of various components of the display panel is also applicable to this embodiment. In an example shown in FIG. 4, N=1200 is taken as an example for explanation. However, embodiments of the present disclosure are not limited to thereto, and a value of N may be set as required.

As shown in FIG. 4, the shift registers GOA1, GOA2, . . . , GOA1200 are distributed on opposite sides of the display region AA. For ease of description, the shift registers GOA1, GOA3, GOA5, . . . , GOA1199 which are located on a first side (left side in FIG. 4) of the display region AA along a first direction are referred to as first shift registers, and the shift registers GOA2, GOA4, GOA6, . . . , GOA1200 which are located on a second side (right side in FIG. 4) of the display region AA along the first direction are referred to as second shift registers. The first shift registers GOA1, GOA3, GOA5, . . . , GOA1199 are cascaded, and the second shift registers GOA2, GOA4, GOA6, . . . , GOA1200 are cascaded. The so-called cascaded here means that an output terminal of a current shift register is used as an input terminal of a subsequent stage shift register. For example, an output terminal of an $i^{th}$ stage shift register may be connected to an input terminal of an $(i+d)^{th}$ stage shift register, where each of $i^{th}$ and d is a positive integer. Taking the shift registers on the left as an example, an output terminal of the shift register GOA1 is connected to an input terminal of the shift register GOA3, an output terminal of the shift register GOA3 is connected to an input terminal of the shift register GOA5, and so on. Each shift register generates an output signal shifted relative to an input signal at its output terminal in response to the input signal at its respective input terminal. By being cascaded, an output signal of the subsequent stage shift register is shifted relative to an output signal of a previous stage shift register, thereby achieving shifted registration. Similarly, the shift registers on the right side may also be connected in a cascaded manner. Although the previous text has provided an explanation by taking cascading stage by stage as an example, that is the output terminal of the current stage shift register is connected to an output terminal of its next stage shift register, the embodiments of the present disclosure are not limited to thereto, and a value of d may be arbitrarily set as required.

With continued reference to FIG. 4, the auxiliary circuits A1, A2, . . . , GOA1200 are also distributed on opposite sides of the display region AA. For ease of description, the auxiliary circuits A1, A3, A5, . . . , A1199 which are located on the second side (right side) of the display region AA will be referred to as first auxiliary circuits, and the auxiliary circuits A2, A4, A6, . . . , A1200 which are located on the first side (left side) of the display region AA will be referred to as second auxiliary circuits.

The plurality of gate lines G1, G2, . . . , G1200 may include a plurality of first gate lines G1, G3, G5, . . . , G1199 and a plurality of second gate lines G2, G4, G6, . . . , G1200 which are alternately disposed with the plurality of first gate lines G1, G3, G5, . . . , G1199. In this embodiment, a respective first end of each of the first gate lines G1, G3, G5, . . . , G1199 is located on the first side of the display region and connected to a corresponding first shift register of the plurality of first shift registers GOA1, GOA3, GOA5, . . . , GOA1199, and a respective second end of each of the first gate lines G1, G3, G5, . . . , G1199 is located on the second side of the display region AA and connected to a corresponding first auxiliary circuit of the plurality of first auxiliary circuits A1, A3, A5, . . . , A1199. For example, the first end (left end) of the first gate line G1 is connected to the first shift register GOA1 and the second end (right end) of the first gate line G1 is connected to the first auxiliary circuit A1; the first end (left end) of the first gate line G3 is connected to the first shift register GOA3 and the second end (right end) of the first gate line G3 is connected to the first auxiliary circuit A3, and so on. A respective first end of each of the plurality of second gate lines G2, G4, G6, . . . , G1200 is located on the second side of the display region AA and connected to a corresponding second shift register of the plurality of second shift registers GOA2, GOA4, GOA6, . . . , GOA1200, and a respective second end of each of the plurality of second gate lines G2, G4, G6, . . . , G1200 is located on the first side of the display region AA and connected to a corresponding second auxiliary circuit of the plurality of second auxiliary circuits A2, A4, A6 . . . A1200. For example, the second end (left end) of the second gate line G2 is connected to the second auxiliary circuit A2 and the first end (right end) of the second gate line G2 is connected to the second shift register GOA2; the second end (left end) of the second gate line G4 is connected to the second auxiliary circuit A4 and the first end (right end) of the second gate line G4 is connected to the second shift register GOA4, and so on.

In the example in FIG. 4, the first gate lines G1, G3, G5, . . . , G1199 are gate lines connected to odd numbered rows of sub-pixels, and the second gate lines G2, G4, G6 . . . G1200 are gate lines connected to even numbered rows of sub-pixels. However, the embodiments of the present disclosure are not limited to thereto. The first gate lines and the second gate lines may be alternately disposed in other ways. For example, two or more second gate lines are disposed between adjacent two first gate lines, or two or more first gate lines are disposed between adjacent two second gate lines, and so on.

In the example in FIG. 4, k=1, a control terminal of the first auxiliary circuit connected to each first gate line is connected to an output signal terminal of the second shift register connected to the second gate line adjacent to the first gate line. For example, the control terminal of the first auxiliary circuit A1 connected to the first gate line G1 is connected to the output signal terminal of the second shift register GOA2 connected to the first gate line G2, the control terminal of the first auxiliary circuit A3 is connected to the output signal terminal of the second shift register GOA4, and so on. Similarly, a control terminal of the second auxiliary circuit connected to each second gate line is connected to an output signal terminal of the first shift register connected to the first gate line adjacent to the second gate line. For example, the control terminal of the second auxiliary circuit A2 is connected to the output signal terminal of the first shift register GOA3, the control terminal of the second auxiliary circuit A4 is connected to the output signal terminal of the first shift register GOA5, and so on. However, the embodiments of the present disclosure are not limited to thereto. The value of k may be set as required. For example, in a case of k=2, the control terminal of the auxiliary circuit A1 may be connected to the output signal terminal of the shift register GOA4, which will not be repeated here.

In an operation process, the plurality of shift registers GOA1, GOA2, . . . , GOA1200 may sequentially apply scanning signals to the plurality of gate lines G1, G2, . . . , G1200. For example, the shift register GOA1 on the left side generates a first scanning signal and provides the first scanning signal to the gate line G1 to apply a scanning signal, then the shift register GOA2 on the right side generates a second scanning signal and provides the second scanning signal to the gate line G2 to apply a scanning signal, and so on, so as to achieve bilateral interleaving driving. In this process, after the shift register GOA1 outputs the first scanning signal to the gate line G1, the second scanning signal generated by the shift register GOA2 conducts the auxiliary circuit A1 which is connected to the shift register GOA2, so as to provide a reference signal from the reference signal terminal VGL to the gate line G1, thereby shortening a falling time of the signal at the right end of the gate line G1. Similarly, after the shift register GOA2 generates the second scanning signal, a third scanning signal generated by the shift register GOA3 causes the auxiliary circuit A2 to provide a reference signal to the left end of the gate line G2, thereby shortening a falling time of the signal at the left end of the gate line G2, and so on. In this way, a difference of falling time of the signal between two ends of each gate line is reduced, which is conducive to improving the display quality.

Figure 5:
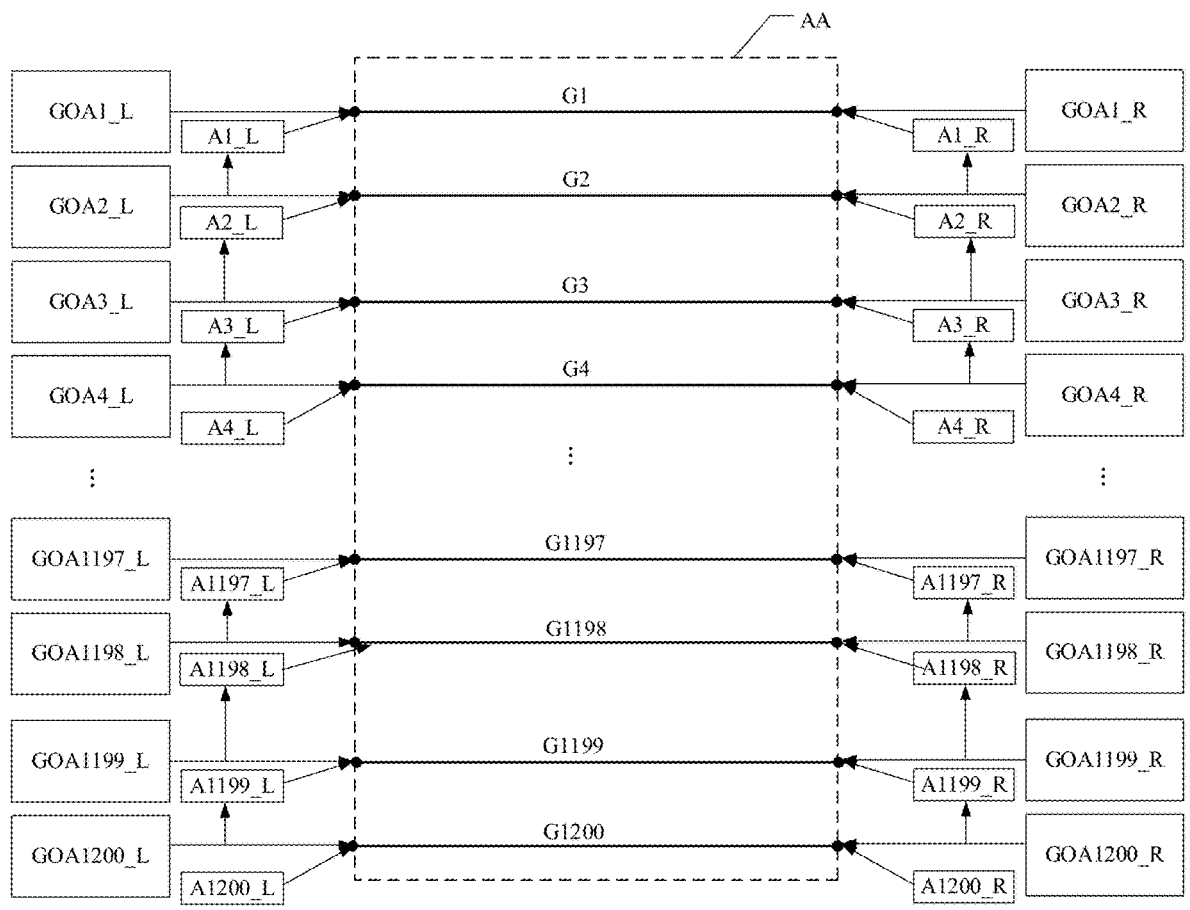
FIG. 5 shows a schematic diagram of a display panel according to another embodiment of the present disclosure.

FIG. 5 shows a schematic diagram of a display panel according to another embodiment of the present disclosure. The display panel 500 in FIG. 5 is similar to the above display panel 400, with differences at least in the arrangement and connection of auxiliary circuits and shift registers. For the sake of brevity, the following will mainly provide a detailed explanation of the differences.

As shown in FIG. 5, the display panel 300 includes a plurality of gate lines G1, G2, . . . , G1200, which are referred to as the first gate lines in this embodiment. Unlike the above embodiments, both sides of the gate line are connected with shift registers and auxiliary circuits. For example, the display panel 300 includes a plurality of first shift registers GOA1_L, GOA2_L, . . . , GOA1200_L which are located on a first side (left side) of the display region AA, and a plurality of third shift registers GOA1_R, GOA2_R, . . . , GOA1200_R which are located on a second side (right side) of the display region AA. The display panel 300 also includes a plurality of first auxiliary circuits A1_R, A2_R, . . . , A1200_R on the second side (right side) of the display region AA, and a plurality of third auxiliary circuits A1_L, A2_L, . . . , A1200_L which are located on the first side (left side) of the display region AA.

The first end (left end) of the gate line G1 is connected to the first shift register GOA1_L, the second end (right end) of the gate line G1 is connected to the third shift register GOA1_R. Similarly, a first end of the gate line G2 is connected to the first shift register GOA2_L, a second end of the gate line G2 is connected to the third shift register GOA2_R, and so on. Correspondingly, the first end (left end) of the gate line G1 is also connected to the third auxiliary circuit A1_L, the second end (right end) of the gate line G1 is also connected to the first auxiliary circuit A1_R, the first end (left end) of the gate line G2 is also connected to the third auxiliary circuit A2_L, and the second end (right end) of the gate line G2 is also connected to the first auxiliary circuit A2_R.

In this embodiment, a control terminal of an $i^{th}$ first auxiliary circuit is connected to an output signal terminal of an $(i+k)^{th}$ stage third shift register, an output terminal of the $i^{th}$ first auxiliary circuit is connected to a second end of an $i^{th}$ first gate line, a control terminal of an $i^{th}$ third auxiliary circuit is connected to an output signal terminal of an $(i+k)^{th}$ stage first shift register, and an output terminal of the $i^{th}$ third auxiliary circuit is connected to a first end of the $i^{th}$ first gate line. As shown in FIG. 5, in a case of k=1, on the first side of the display region AA, a control terminal of the third auxiliary circuit A1_L is connected to an output signal terminal of the first shift register GOA2_L, a control terminal of the third auxiliary circuit A2_L is connected to an output signal terminal of the first shift register GOA3_L, and so on. On the second side of the display region AA, a control terminal of the first auxiliary circuit A1_R is connected to the output signal terminal of the third shift register GOA2_R, a control terminal of the first auxiliary circuit A2_L is connected to an output signal terminal of the third shift register GOA3_L, and so on.

During operation, the shift registers GOA1_L and GOA1_R simultaneously apply scanning signals to the gate line G1, then the shift registers GOA2_L and GOA2_R simultaneously apply scanning signals to the gate line G2, and so on, so as to sequentially apply scanning signals to the plurality of gate lines G1, G2, . . . , G1200. In this way, bilateral simultaneous driving is achieved. In a scanning process, when the first shift register GOA1_L on the left side applies a scanning signal to the gate line G1, a scanning signal generated by the third shift register GOA2_R on the right side conducts the first auxiliary circuit A1_R which is connected to the third shift register GOA2_R, so as to provide a reference signal to the right end of the gate line G1. In this way, the falling time of the signal at the right end of the gate line G1 is shortened and closer to the falling time of the signal at the left end of the gate line G1. Similarly, when the third shift register GOA1_R on the right side applies a scanning signal to the gate line G1, a scanning signal generated by the first shift register GOA2_L on the left side conducts the third auxiliary circuit A1_L connected to the first shift register GOA2_L, so as to provide a reference signal to the left end of the gate line G1. In this way, the falling time of the signal at the left end of the gate line G1 is shortened and closer to the falling time of the signal at the right end of the gate line G1. Other shift registers and other auxiliary circuits operate in a similar manner, which will not be repeated here.

Figure 6:
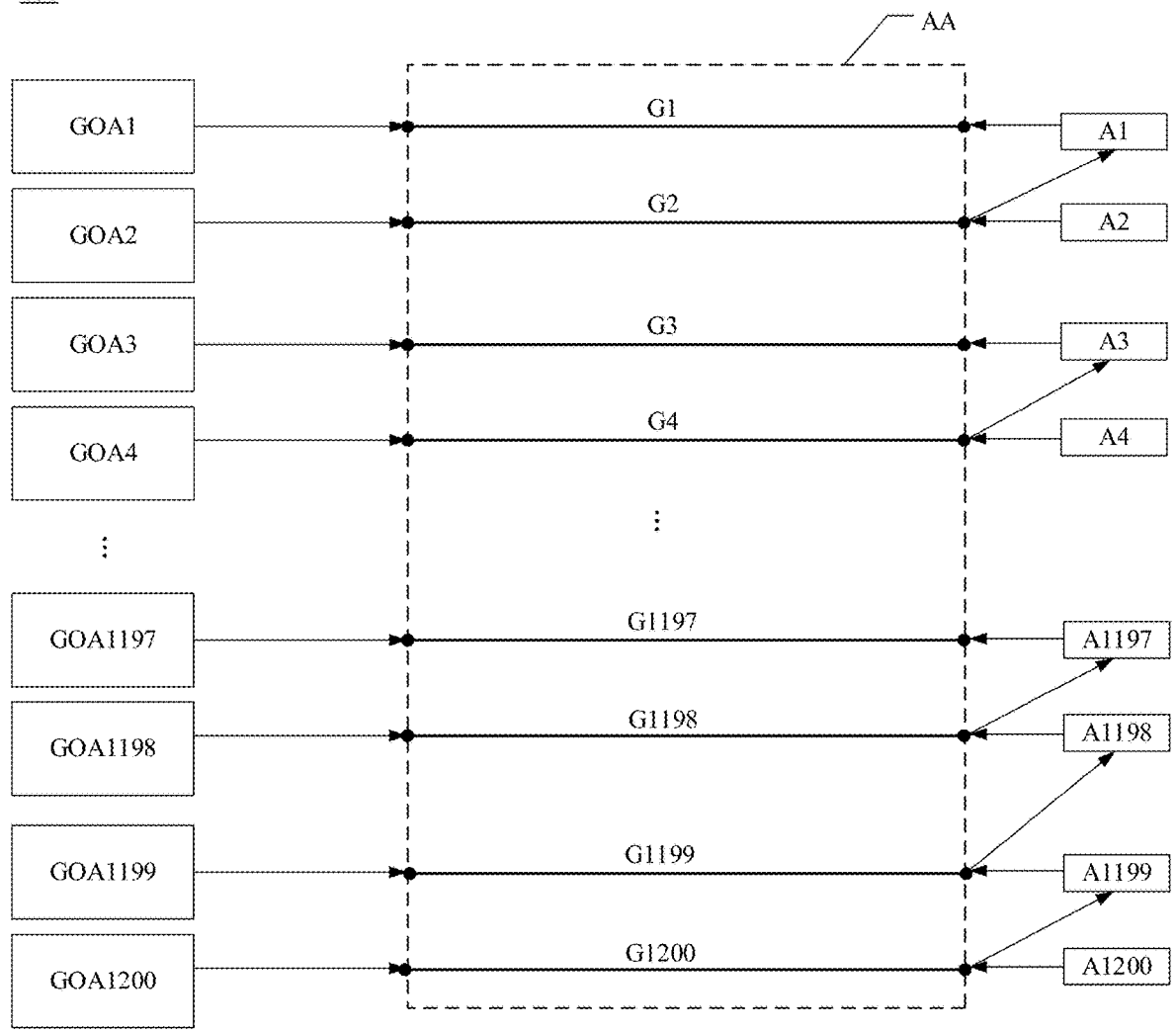
FIG. 6 shows a schematic diagram of a display panel according to another embodiment of the present disclosure.

FIG. 6 shows a schematic diagram of a display panel according to another embodiment of the present disclosure. The display panel 400 in FIG. 6 is similar to the above display panel 400, with differences at least in the arrangement and connection of auxiliary circuits and shift registers. For the sake of brevity, the following will mainly provide a detailed explanation of the differences.

As shown in FIG. 6, the display panel 400 includes a plurality of gate lines G1, G2, . . . , G1200, which are referred to as the first gate lines in this embodiment. Unlike the above embodiments, a plurality of shift registers are disposed on one side of the display region AA, and a plurality of auxiliary circuits are disposed on the other side of the display region AA. As shown in FIG. 6, the plurality of shift registers include a plurality of first shift registers GOA1, GOA2, . . . , GOA1200 located on a first side (left side) of the display region AA in a first direction and cascaded. The plurality of auxiliary circuits include a plurality of first auxiliary circuits A1, A2, . . . , A1200 located on a second side (right side) of the display region AA opposite to the first side of the display region AA along the first direction.

A first end of the gate line G1 is located on the first side of the display region AA and connected to the first shift register GOA1 and a second end of the gate line G1 is located on the second side of the display region AA and connected to the first auxiliary circuit A1; a first end of the gate line G2 is located on the first side of the display region AA and connected to the first shift register GOA2 and a second end of the gate line G2 is located on the second side of the display region AA and connected to the first auxiliary circuit A2, and so on.

In this embodiment, a control terminal of an $i^{th}$ first auxiliary circuit is connected to a second end of an $(i+k)^{th}$ first gate line, and an output terminal of the $i^{th}$ first auxiliary circuit is connected to a second end of an $i^{th}$ first gate line. As shown in FIG. 6, in a case of k=1, a control terminal of the first auxiliary circuit A1 (i.e., a first first auxiliary circuit) is connected to the second end of the gate line G2 (i.e., a second first gate line), an output terminal of the first auxiliary circuit A1 is connected to the second end of the gate line G1 (i.e., a first first gate line); a control terminal of the first auxiliary circuit A2 (i.e., a second first auxiliary circuit) is connected to a second end of a gate line G3 (i.e., a third first gate line), an output terminal of the first auxiliary circuit A2 is connected to the second end of the gate line G2, and so on.

During operation, the shift register GOA1 applies a scanning signal to the gate line G1, then the shift register GOA2 applies a scanning signal to the gate line G2, and so on, so as to sequentially apply scanning signals to the plurality of gate lines G1, G2, . . . , G1200. In this way, unilateral driving is achieved. In a scanning process, when the first shift register GOA1 applies the scanning signal to the left end of the gate line G1, the scanning signal provided by the first shift register GOA2 to the gate line G2 is provided to the first auxiliary circuit A1 through the right end of the gate line G2, so that the first auxiliary circuit A1 is in a conductive state, thereby providing a reference signal to the right end of the gate line G1. In this way, the falling time of the signal at the right end of the gate line G1 is shortened and closer to the falling time of the signal at the left end of the gate line G1. Other shift registers and other auxiliary circuits operate in a similar manner, which will not be repeated here.

The structures and layouts of the display panel are described above in conjunction with various embodiments. According to embodiments of the present disclosure, a size of the display panel may be arbitrarily selected as required, for example, but not limited to in a range of 8 inches to 15 inches. A resolution of the display panel may be set as required, for example, but not limited to 2160×1440. In some embodiments, a material of the gate line may be metal, including but not limited to aluminum or copper. A length of the gate line may be set according to the size of the display panel, for example, in a range of 200 mm to 300 mm. For example, it may be substantially 265 mm. In some embodiments, it may be 265.68 mm. A resistance of the gate line may be substantially in a range of 4.5 kΩ to 5.5 kΩ. For example, it may be 5 kΩ. In some embodiments it may be 4.95 kΩ. A capacitance of the gate line may be in a range of 250 pf to 350 pf. For example, it may be substantially 300 pf. In some embodiments, it may be 284.3 pf.

A structure and operating principle of a shift register in a display panel of an embodiment of the present disclosure will be described below with reference to FIG. 7 and FIG. 8.

Figure 7:
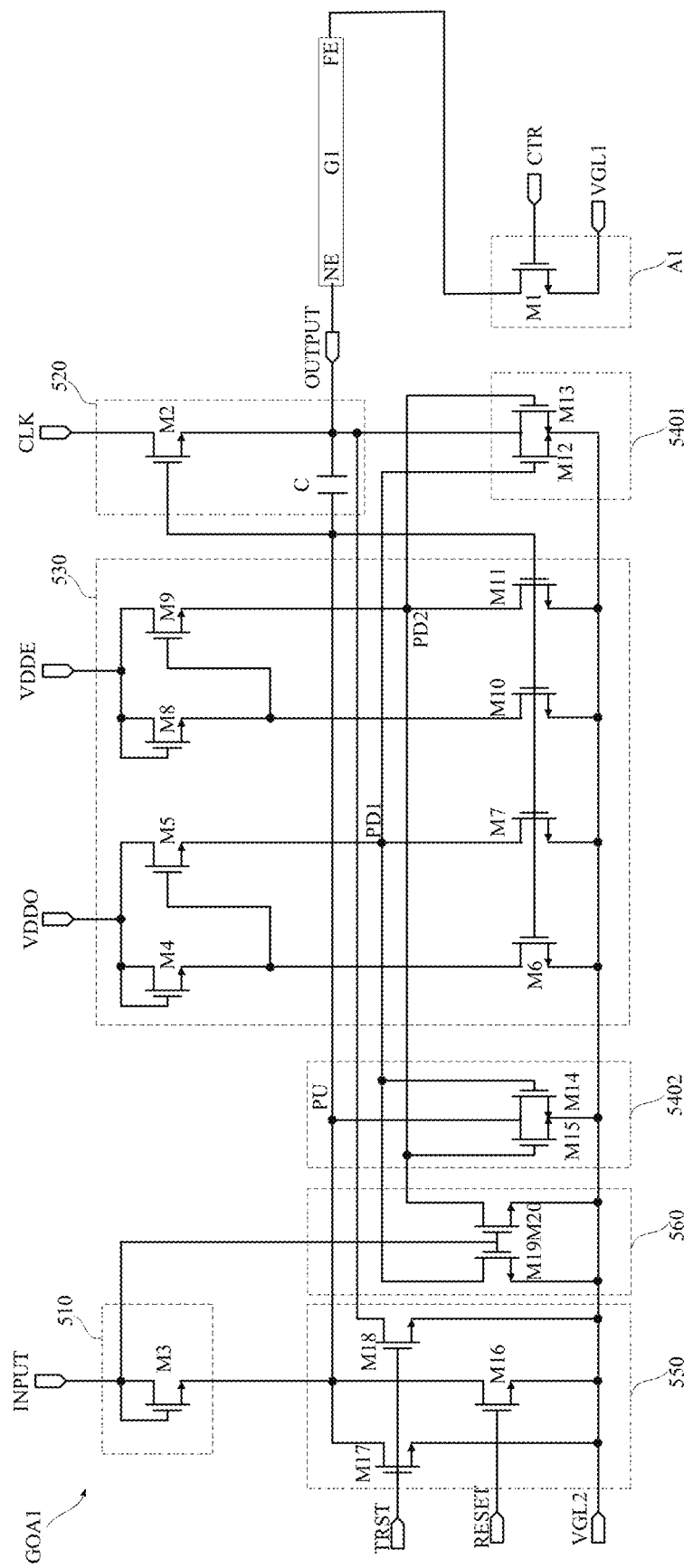
FIG. 7 shows a circuit diagram of a shift register in a display panel according to an embodiment of the present disclosure.

FIG. 7 shows a circuit diagram of a shift register in a display panel according to an embodiment of the present disclosure. The structure of the shift register is applicable to the display panel of any of the above embodiments. For ease of description, in FIG. 7, a first gate line G1 is taken as an example for illustration. As shown in FIG. 7, one end of the gate line G1 is connected to a shift register GOA1, and the other end of the gate line G1 is connected to an auxiliary circuit A1. An end of the gate line G1 connected to the shift register GOA1 is referred to as a near end (represented by NE), and an end opposite to the near end is referred to as a far end (represented by FE). Although the shift register GOA1 and the auxiliary circuit A1 are shown in FIG. 7 to be respectively located at the left end and the right end of the gate line G1, this is only for illustration, and the positions of the two may be interchanged.

As shown in FIG. 7, the auxiliary circuit A1 includes a transistor M1 (first transistor). A gate of the transistor M1 is connected to receive an auxiliary signal CTR as a control terminal of the auxiliary circuit A1. According to the different embodiments described above, the auxiliary signal CTR may be from output signal terminals of other shift registers or from other gate lines. A first electrode of the transistor M1 is connected to a reference signal terminal VGL1 for providing a reference signal as an input terminal of the auxiliary circuit A1. A second electrode of the transistor M1 is connected to the other end FE of the gate line G1 as an output terminal of the auxiliary circuit A.

As shown in FIG. 7, the shift register GOA1 may include an input circuit 510, an output circuit 520, a control circuit 530, and a pull-down circuit. In an example of FIG. 7, the pull-down circuit may include a first pull-down circuit 5401 and a second pull-down circuit 5402, which are collectively referred to as the pull-down circuit 540.

The input circuit 510 is connected to an input signal terminal INPUT of the shift register GOA1 and a pull-up node PU of the shift register GOA1. The input circuit 510 may provide a signal of the input signal terminal INPUT to the pull-up node PU.

The output circuit 520 is connected to the pull-up node PU, a clock signal terminal CLK of the shift register GOA1 and an output signal terminal OUTPUT of the shift register GOA1. The output circuit 520 may provide a signal from the clock signal terminal CLK to the output signal terminal OUTPUT under control of the pull-up node PU, so as to output the scanning signal.

The control circuit 530 is connected to the pull-up node PU and a pull-down node of the shift register GOA1. In this embodiment, there are two pull-down nodes, respectively referred to PD1 and PD2, which are collectively referred to as pull-down node PD. However, the embodiments of the present disclosure are not limited to thereto. In some embodiments, the shift register may include one of the two pull-down nodes mentioned above. The control circuit 530 is used to control a potential of the pull-down node PD based on a potential of the pull-up node PU.

The pull-down circuit 540 is connected to the output signal terminal OUTPUT and the pull-down node PD. The pull-down circuit 540 may pull down a potential of the output signal terminal OUTPUT under control of the pull-down node PD. For example, the first pull-down circuit 5401 is connected to the pull-down nodes PD1 and PD2, and may pull down the potential of the output signal terminal OUTPUT under control of the pull-down nodes PD1 and PD2. The second pull-down circuit 5402 is connected to the pull-down nodes PD1 and PD2, and pulls down the potential of the pull-up node PU under control of the pull-down nodes PD1 and PD2.

In some embodiments, the shift register GOA1 may also include a reset circuit 550. The reset circuit 550 is connected to the pull-up node PU and a reset signal terminal of the shift register GOA1. In some embodiments, the reset signal terminal may include a first reset signal terminal RESET, which is used to receive a reset signal for resetting a current stage shift register. In other embodiments, the reset signal terminal may also include a second reset signal terminal TRST, which is used to receive a total reset signal for resetting multi-stage shift registers including the current stage shift register. The reset circuit 550 may reset the pull-up node PU under control of the reset signal RESET. The reset circuit 550 may also reset the pull-up node PU under control of the reset signal terminal TRST.

In some embodiments, the shift register GOA1 may also include a noise reduction circuit 560. The noise reduction circuit 560 is connected to the input signal terminal INPUT and the pull-down nodes PD1 and PD2, and may perform noise reduction on the pull-down nodes PD1 and PD2 under control of the input signal terminal INPUT.

In some embodiments, as shown in FIG. 7, the output circuit 520 may include a transistor M2 and a capacitor C. A gate of the transistor M2 is connected to the pull-up node PU, a first electrode of the transistor M2 is connected to the clock signal terminal CLK, and a second electrode of the transistor is connected to the output signal terminal OUTPUT. A first electrode of the capacitor C is connected to the pull-up node PU, and the second electrode of the capacitor C is connected to the output signal terminal OUTPUT.

The input circuit 510 may include a transistor M3. A gate of the transistor M3 and a first electrode of the transistor M3 are connected to the input signal terminal INPUT, and a second electrode of the transistor M3 is connected to the pull-up node PU.

The control circuit 530 may include at least one of a first control circuit and a second control circuit. For example, in FIG. 7, the first control circuit includes transistors M4, M5, M6 and M7. A gate of the transistor M4 and a first electrode of the transistor M4 are connected to a power signal terminal VDDO, and a second electrode of the transistor M4 is connected to a gate of the transistor M5. A first electrode of the transistor M5 is connected to the power signal terminal VDDO, and a second electrode of the transistor M5 is connected to a pull-down node PD1. A gate of the transistor M6 and a gate of the transistor M7 are connected to the pull-up node PU, and a first electrode of the transistor M6 and a first electrode of the transistor M7 are connected to a reference signal terminal VGL2. A second electrode of the transistor M6 is connected to the gate of the transistor M5, and a second electrode of the transistor M7 is connected to the pull-down node PD1. Similarly, the second control circuit includes transistors M8, M9, M10 and M11. A gate of the transistor M8 and a first electrode of the transistor M8 are connected to a power signal terminal VDDE, and a second electrode of the transistor M8 is connected to a gate of the transistor M9. A first electrode of the transistor M9 is connected to the power signal terminal VDDE, and a second electrode of the transistor M9 is connected to a pull-down node PD2. A gate of the transistor M10 and a gate of the transistor M11 are connected to the pull-up node PU, and a first electrode of the transistor M10 and a first electrode of the transistor M11 are connected to the reference signal terminal VGL2. A second electrode of the transistor M10 is connected to the gate of transistor M9, and a second electrode of transistor M11 is connected to the pull-down node PD2. According to the embodiments of the present disclosure, the power signal terminals VDDO and VDDE may alternately be high level. For example, during a period when the power signal terminal VDDO receives a high-level power signal, the power signal terminal VDDE receives a low-level power signal, and vice versa. In this way, the first control circuit and the second control circuit may be alternately operated, so as to avoid a device loss caused by a long-time conduction of the transistors in the control circuit 530.

The first pull-down circuit 5401 may include at least one of a transistor M12 and a transistor M13. The second pull-down circuit 5402 may include at least one of a transistor M14 and a transistor M15. As shown in FIG. 7, a gate of the transistor M12 is connected to the pull-down node PD1, and a gate of transistor M13 is connected to the pull-down node PD2. A first electrode of the transistor M12 and a first electrode of the transistor M13 are connected to the reference signal terminal VGL2, and the first electrode of the transistor M12 and the first electrode of the transistor 13 are connected to the output signal terminal OUTPUT. Similarly, a gate of the transistor M14 is connected to the pull-down node PD1, and a gate of the transistor M15 is connected to the pull-down node PD2. A first electrode of the transistor M14 and a first electrode of the transistor M15 are connected to the reference signal terminal VGL2, and the first electrode of the transistor M14 and the first electrode of the transistor 15 are connected to the pull-up node PU.

The reset circuit 550 may include a transistor M16. In some embodiments, the reset circuit 550 may also include transistors M17 and M18. As shown in FIG. 7, a gate of the transistor M16 is connected to the reset signal terminal RESET, a first electrode of the transistor M16 is connected to the reference signal terminal VGL2, and a second electrode of the transistor M16 is connected to the pull-up node PU. A gate of the transistor M17 and a gate of the transistor M18 are connected to the reset signal terminal TRST, and a first electrode of the transistor M17 and a first electrode of the transistor M18 are connected to the reference signal terminal VGL2. A second electrode of transistor M17 is connected to the pull-up node PU, and a second electrode of transistor M8 is connected to the output signal terminal OUTPUT.

The noise reduction circuit 560 may include at least one of a transistor M19 and a transistor M20. As shown in FIG. 7, a gate of the transistor M19 and a gate of the transistor M20 are connected to the input signal terminal INPUT. A first electrode of the transistor M19 and a first electrode of the transistor M20 are connected to the reference signal terminal VGL2. A second electrode of the transistor M19 is connected to the pull-down node PD1, and a second electrode of the transistor M20 is connected to the pull-down node PD2.

At least one of the transistors M1 to M20 mentioned above is a thin film transistor. For example, at least one of the transistors M1 and M2 may be a thin film transistor. In some embodiments, the above-mentioned transistors M1 to M20 may be thin film transistors. A channel width of each thin film transistor may be set as required, such as a size of the display panel, a material of the gate line, a length of the gate line, and electrical characteristics of the gate line. In some embodiments, when a space reserved for the transistors M1 and M2 in the display panel is limited, the size of the transistors M1 and M2 may be designed by comprehensively considering the length and material of the gate line in a size range of the reserved space, in order to optimize the effect of reducing the falling time of the signal on the gate line. For example, the transistor M1 may operate in a range of 1800 μm to 2200 μm, for example, it may be substantially 2000 μm. The channel width of the transistor M2 may be in a range of 5800 μm to 6200 μm, for example, it may be substantially 6000 μm. The channel length of each transistor may be set in a range of 3 μm to 6 μm, for example, it may be 4.0 um.

Although two reference signal terminals VGL1 and VGL2 are taken as an example for illustration in the above embodiments, the embodiments of the present disclosure are not limited to thereto. The reference signal terminals VGL1 and VGL2 may be implemented as the same reference signal terminal.

Figure 8:
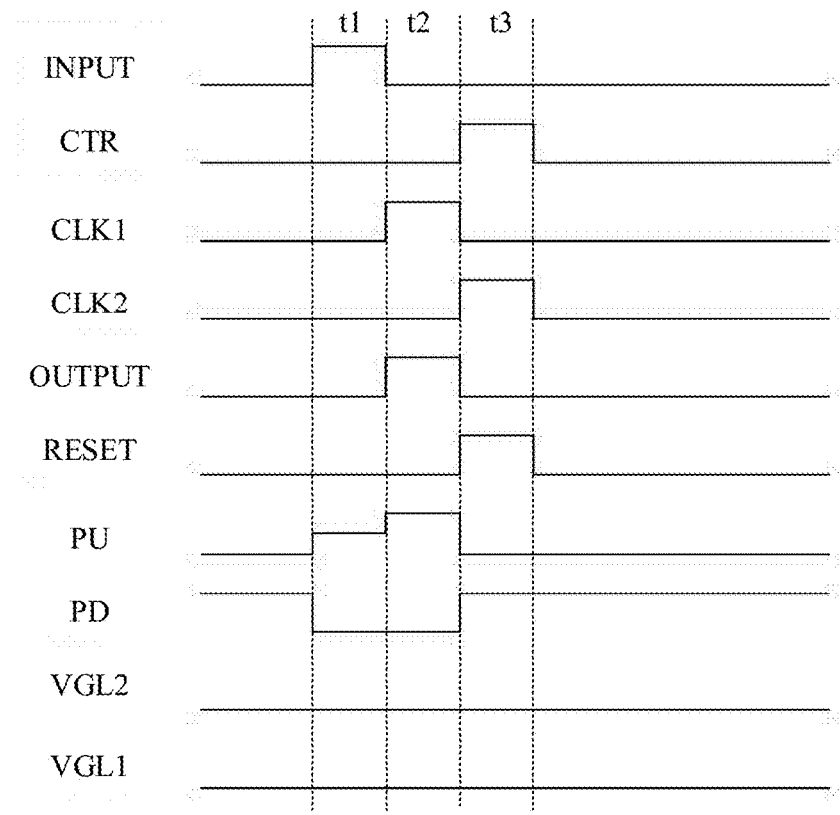
FIG. 8 shows a signal timing diagram of the shift register in FIG. 7.

FIG. 8 shows a signal timing diagram of the shift register in FIG. 7.

Considering that power signal terminals VDDO and VDDE operate alternately, the power signal terminal VDDO being at a high level and the power signal terminal VDDE being at a low level during a certain period of time are taken an example for illustration in this embodiment. Therefore, during a scanning period shown in FIG. 8, a first control circuit controlled by the power signal terminal VDDO is in an operating state, and a second control circuit controlled by the power signal terminal VDDE is in a non-operating state. With reference to FIG. 7 and FIG. 8, the clock signal terminal CLK of the shift register GOA1 may receive a clock signal CLK1, and the clock signal terminal of its next stage shift register (such as GOA2) may receive a clock signal CLK2, so as to output an output signal shifted relative to the output signal of the shift register GOA1. In some embodiments, a shift register connected to an odd-numbered gate line may receive the clock signal CLK1, and a shift register connected to an even-numbered gate line may receive the clock signal CLK2. Certainly, the embodiments of the present disclosure are not limited to thereto. More clock signals (such as 4, 8, 12, or 16) may be set as required and provided to each shift register in a manner suitable for a cascaded structure of the shift register.

In period t1, the input signal terminal INPUT receives a high level input signal, so that the transistor M3 is turned on, thereby turning the pull up node PU point into a high level. The high level of the pull up node PU charges the capacitor C and turns on the transistor M2. At this time, since the first clock signal CLK1 received by the clock signal terminal CLK is still at a low level, although the transistor M2 is turned on, the output signal terminal OUTPUT remains at a low level. The transistors M6 and M7 are turned on by the high level of the pull up node PU, thereby providing a low level of the reference signal terminal VGL2 to the pull down node PD1. In addition, the transistors M19 and M20 are turned on by the high level of the input signal terminal INPUT, so as to stabilize the pull down nodes PD1 and PD2 at low levels, thereby reducing noises of the pull down nodes PD1 and PD2 by the noise reduction circuit 560.

In period t2, the clock signal CLK1 received by the clock signal terminal CLK changes from a low level to a high level. At this time, since the transistor M2 is turned on, the high level of the clock signal CLK1 is provided to the output signal terminal OUTPUT, thereby outputting a high level scanning signal. In this process, due to a bootstrapping of the capacitor C, the potential of the pull up node PU increases again on an original basis.

In period t3, the reset signal terminal RESET receives a high level reset signal. For example, when the reset signal terminal RESET is connected to the output signal terminal of the next stage shift register, the scanning signal output by the next stage shift register is taken as the reset signal. The transistor M16 is turned on by the high level of the reset signal terminal RESET, thereby pulling down the potential of the pull up node PU to the low level. The transistors M6 and M7 in the control circuit 530 are turned off and the transistor M5 is turned on by the low level of the pull up node PU, thereby providing the high level of the power supply signal terminal VDDO to the pull down node PD1. The transistor M12 is turned on by the high level of the pull down node PD1, thereby pulling down the output signal terminal OUTPUT to the low level of the reference signal terminal VGL2. In this process, the auxiliary signal CTR received by the auxiliary circuit A1 is at a high level. For example, when the scanning signal output by the next stage shift register is received as the auxiliary signal, the auxiliary signal is at a high level. The transistor M1 is turned on by the high level of the auxiliary signal CTR, providing the low level of the reference signal terminal VGL1 to the output signal terminal OUTPUT. In this way, the falling of the signal at the output signal terminal OUTPUT is accelerated, thereby reducing the difference in the falling time of the signal between the two ends of the gate line G1. In addition, in this period, the transistor M14 is turned on by the high level of the pull down node PD1, thereby further pulling down the potential of the pull up node PU.

So far, a scanning is achieved, that is an application of a scanning signal to one gate line G1 is completed. Therefore, this time period containing t1, t2, and t3 is referred to as a scanning period. The time periods t1 and t2 may be referred to as a first time period of the scanning period, and the time period t3 may be referred to as a second time period of the scanning period. The output of the scanning signal is completed in the first time period, and the reset and accelerated descent of the scanning signal are completed in the second period. By repeating the above operation for each gate line, the scanning of all gate lines may be completed. The scanning periods of the respective gate lines may overlap with each other, for example, the periods t2 and t3 of the previous scanning period may overlap with the periods t1 and t2 of the following scanning period.

Although the above embodiments are illustrated by taking a specific shift register circuit structure as an example, the embodiments of the present disclosure are not limited to thereto. The display panel of the embodiments of the present disclosure may employ any suitable circuit structures of shift register, such as but not limited to shift register structures such as 9T1C, 11T1C, 19T1C, etc.

Figure 9:
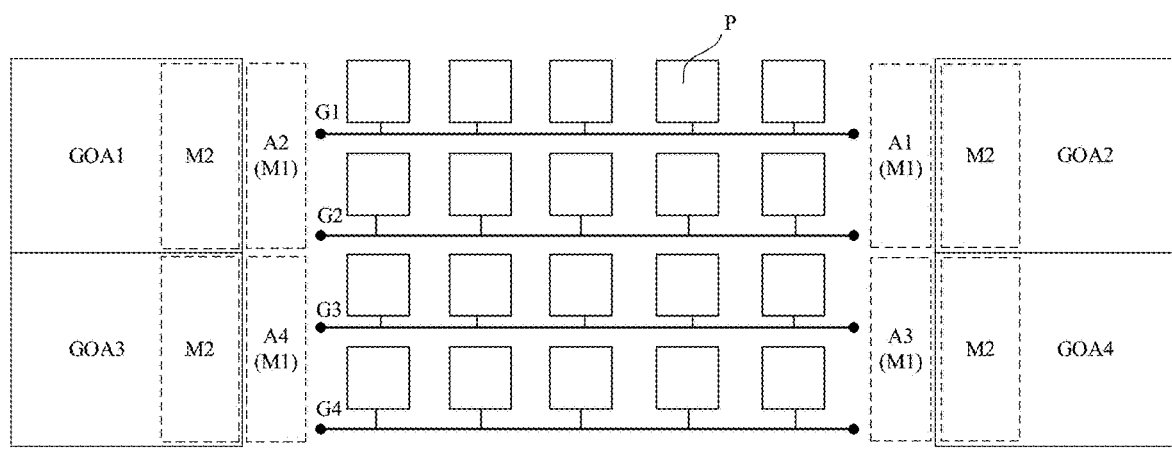
FIG. 9 shows a schematic plan view of a display panel according to an embodiment of the present disclosure.

FIG. 9 shows a plan schematic view of a display panel according to an embodiment of the present disclosure. The planar layout of FIG. 9 may be applied to, for example, the circuit structure of FIG. 4. Therefore, the layout of FIG. 9 will be described below with reference to FIG. 4. In FIG. 9, for the sake of illustration, the connection wirings between the gate lines and the auxiliary circuits, and the connection wirings between the gate lines and the shift registers are omitted.

As shown in FIG. 9, a first auxiliary circuit A1 connected to a gate line G1 and a second shift register GOA2 connected to a gate line G2 are located on a second side (right side) of a display region AA. The first auxiliary circuit A1 is located between the display region AA and the second shift register GOA2. In FIG. 9, a transistor M1 in the first auxiliary circuit A1 is located between a transistor M2 in the second shift register GOA2 and the display region AA, so that the second ends of the gate lines G1 and G2 in the display region AA are located on a side of the transistor M1 in the auxiliary circuit A1 away from the transistor M2 in the first shift register GOA1. Similarly, the first shift register GOA1 connected to the gate line G1 and the second auxiliary circuit A2 connected to the gate line G2 are located on a first side (left side) of the display region AA. The second auxiliary circuit A2 is located between the display region AA and the first shift register GOA1. The first auxiliary circuit A3, the second auxiliary circuit A4, the first shift register GOA3 and the second shift register GOA4 connected to the gate lines G3 and G4 are arranged in a similar manner, and so on.

As shown in FIG. 9, a size of each of the first auxiliary circuits A1, A3, A5 . . . and the second auxiliary circuits A2, A4, A6 . . . in a second direction is substantially equal to a sum of sizes of two rows of sub-pixels P in the second direction (a longitudinal direction in FIG. 9, i.e. y direction). A size of the auxiliary circuit may be indicated by a size of a projection of the transistors inside the auxiliary circuit on the base substrate. For example, the size of the projection of each transistor M1 and M2 on the base substrate in the longitudinal direction is substantially equal to the size of the projection of adjacent two rows of sub-pixels on the base substrate in the longitudinal direction.

Figure 10:
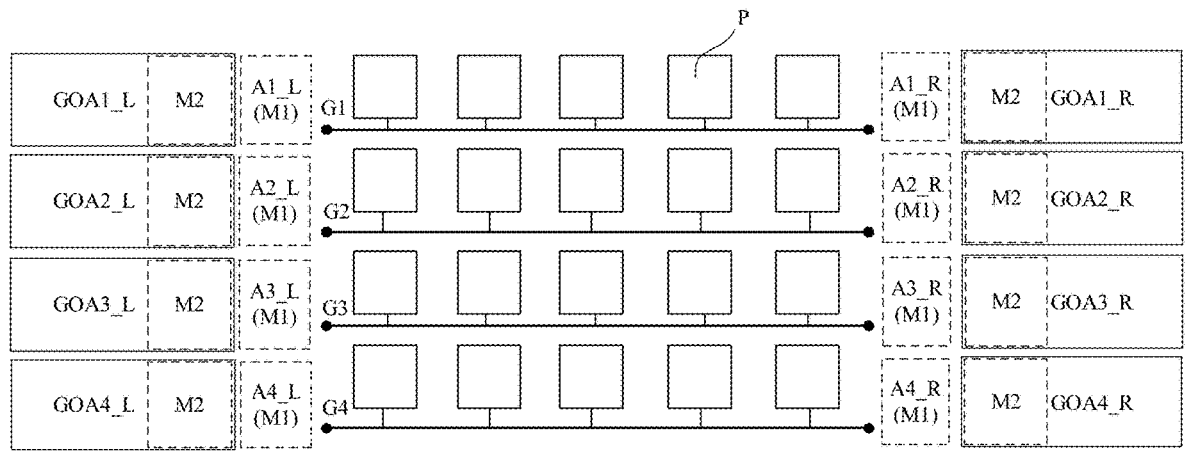
FIG. 10 shows a schematic plan view of a display panel according to another embodiment of the present disclosure.

FIG. 10 shows a plan schematic view of a display panel according to another embodiment of the present disclosure. The planar layout of FIG. 10 may be applied to, for example, the circuit structure of FIG. 5. Therefore, the layout of FIG. 10 will be described below with reference to FIG. 5.

As shown in FIG. 10, a first auxiliary circuit A1_R is located between the display region AA and a third shift register GOA1_R, a third auxiliary circuit A1_L is located between the display region AA and the first shift register GOA1_L. Specifically, the transistor M1 in the first auxiliary circuit A1_R is located between a second end (right end) of the gate line G1 and a transistor M2 of the third shift register GOA1_R, and the transistor M1 in the third auxiliary circuit A1_L is located between the first end (left end) of the gate line G1 and the transistor M2 of the first shift register GOA1_L.

Since FIG. 5 has a larger number of shift registers and auxiliary circuits compared to FIG. 4, their sizes and positions are adjusted accordingly. As shown in FIG. 10, a size of each auxiliary circuit (i.e. the transistor M1), including the first auxiliary circuit and the third auxiliary circuit, in a second direction is substantially equal to a size of one row of sub-pixels P in the second direction (longitudinal).

Figure 11:
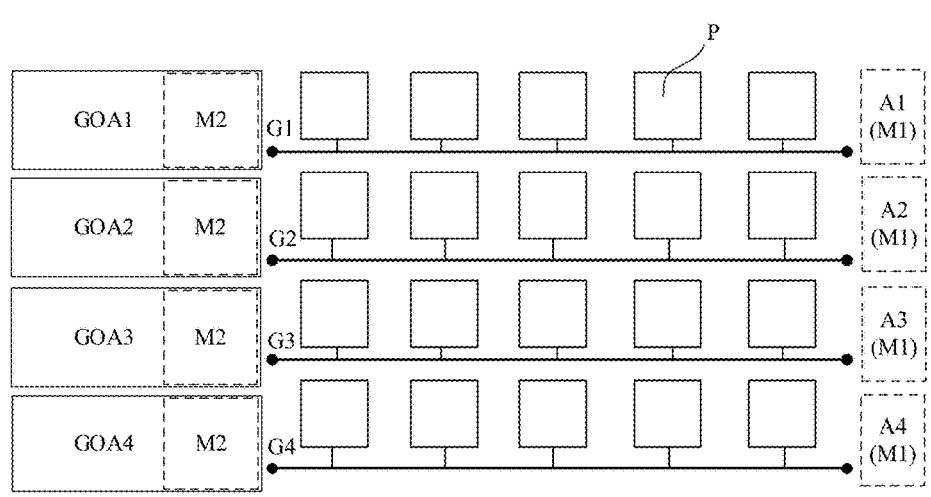
FIG. 11 shows a schematic plan view of a display panel according to another embodiment of the present disclosure.

FIG. 11 shows a plan schematic view of a display panel according to another embodiment of the present disclosure. The planar layout of FIG. 11 may be applied to, for example, the circuit structure of FIG. 6. Therefore, the layout of FIG. 11 will be described below with reference to FIG. 6.

As shown in FIG. 11, the first shift registers GOA1, GOA2, GOA3 . . . are disposed on a first side (left side) of the display region AA, and the first auxiliary circuits A1, A2, A3 . . . are disposed on a second side (right side) of the display region AA. Similar to FIG. 10, a size of each auxiliary circuit (i.e. the transistors therein), including the first auxiliary circuit and the third auxiliary circuit, in a second direction is substantially equal to a size of one row of sub-pixels P in the second direction (longitudinal).

Figure 12A:
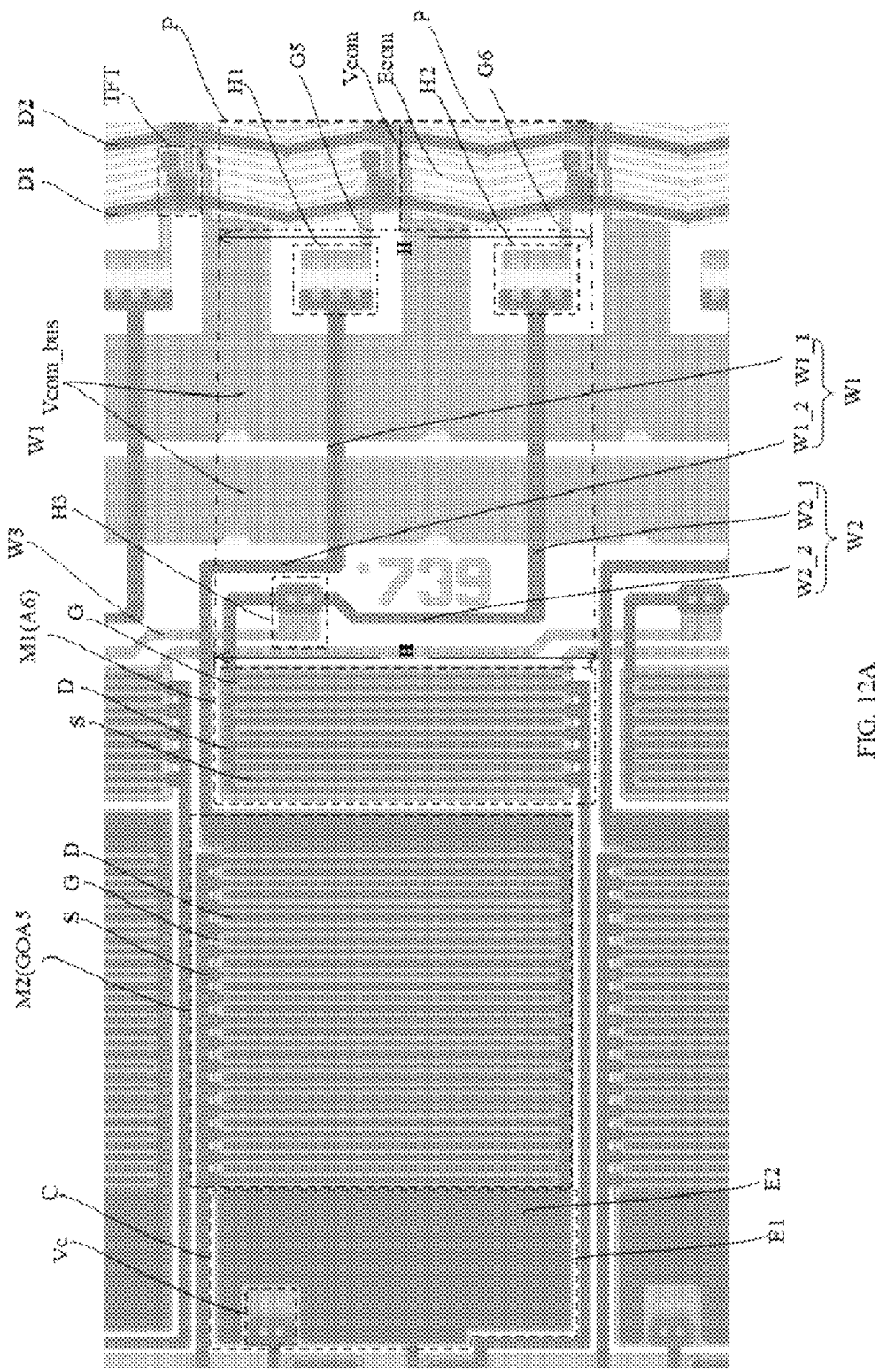
FIGS. 12A and 12B show layouts of a part of the display panel in FIG. 9.
Figure 12B:
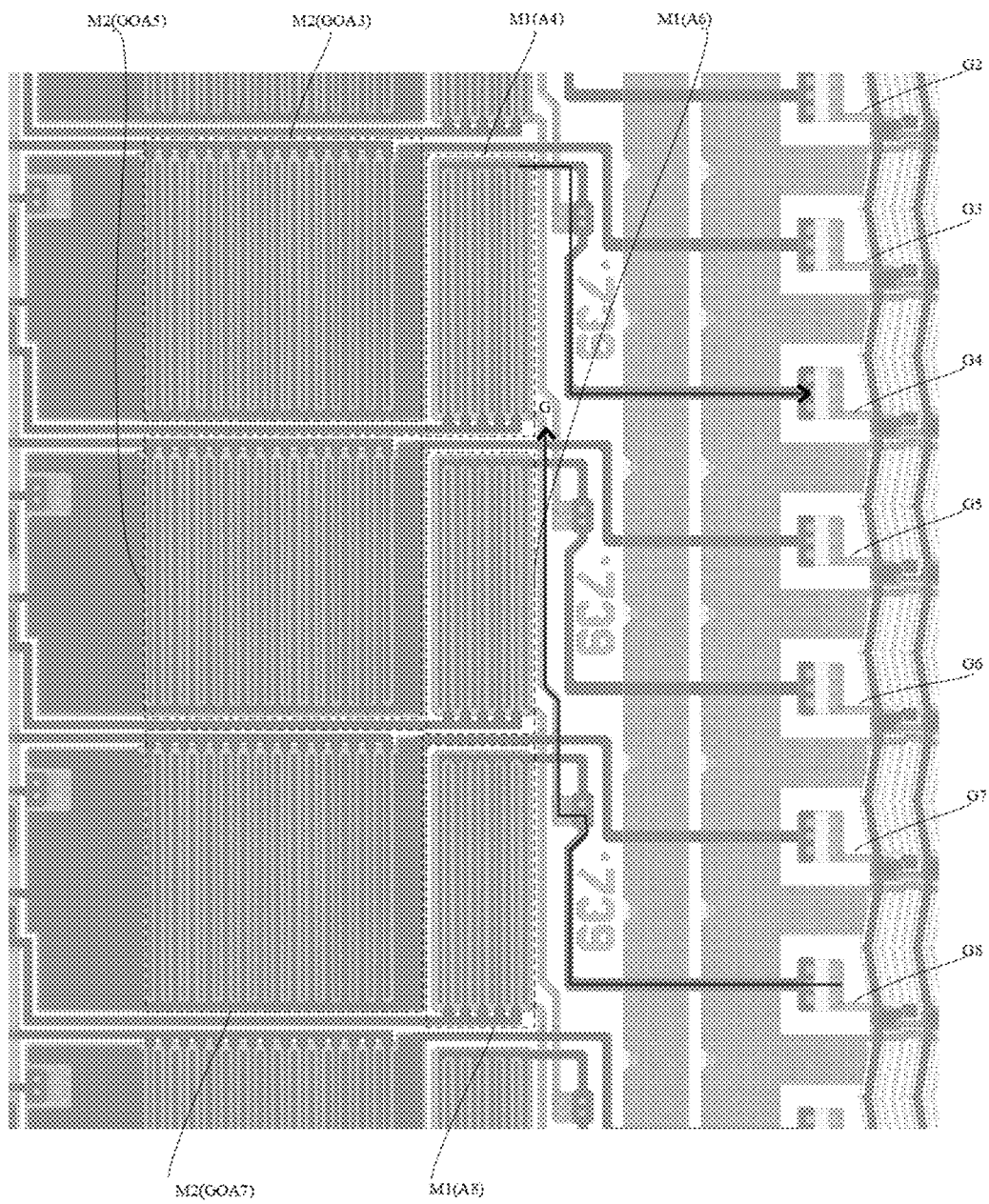
Figure 12C:
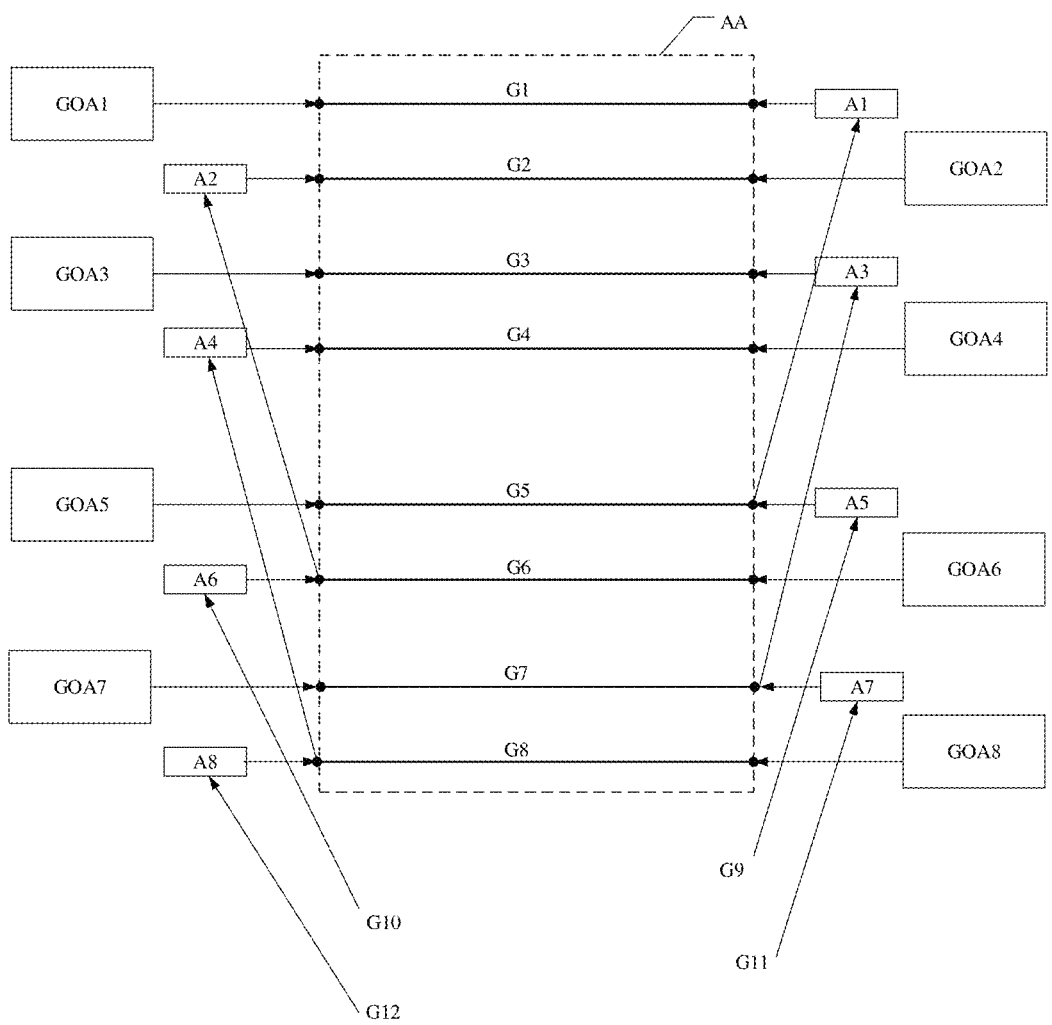
FIG. 12C shows a schematic view of the layout of a part of the display panel shown in FIG. 12B.

FIGS. 12A and 12B show partial layout views of the display panel in FIG. 9, and FIG. 12C shows a schematic view of the layout of a part of the display panel shown in FIG. 12B. FIG. 12A is periodically expanded to obtain FIG. 12B—that is, the layout view in FIG. 12B is shown for a larger sub-region of the display panel, with shift registers GOA3 and GOA7 on opposite sides of shift register GOA5 being visible, with auxiliary circuits A4 and A8 on opposite sides of auxiliary circuit A6 being visible, and with gate lines G2-G4 and G7-G8 on opposite sides of gate lines G5-G6 being visible.

As shown in FIGS. 12A and 12B, the display region AA is provided with a plurality of gate lines extending in a first direction (only gate lines G5 and G6 are marked in FIG. 12A), and a plurality of data lines extending in a second direction (only data lines D1 and D2 are shown in FIG. 12A). The display region AA is also provided with a plurality of sub-pixels arranged in an array, each of which may include one or more transistor TFTs. In FIGS. 12A and 12B, each row of sub-pixels is connected to a same gate line, and each column of sub-pixels is connected to a data line. For example, a fifth row of sub-pixels is connected to a gate line G5, a sixth row of sub-pixels is connected to a gate line G6, a first column of sub-pixels is connected to a data line D1, a second column of sub-pixels is connected to a data line D2, and so on. In the display region AA, there are also provided a plurality of common electrodes Ecom and a plurality of common electrode lines Vcom extending in the first direction and arranged in the second direction. The common electrode Ecom may have a hollow pattern and be connected to the common electrode line Vcom. The common electrode line Vcom is connected to the common electrode bus Vcom_bus located in the peripheral region outside the display region AA. In FIGS. 12A, a transistor M2 of a shift register GOA5 and a transistor M1 of an auxiliary circuit A6 are located in the peripheral region outside the display region AA, and each of the transistor M2 and the transistor M1 has a source S, a drain D and a gate G.

As shown in FIG. 12A, a first end of the gate line G5 is connected to the drain D of the transistor M2 of the shift register GOA5 by a wiring W1. For example, the first end of the gate line G5 is connected to the wiring W1 through a crossover hole H1, and connected to the drain D of the transistor M2 of the shift register GOA5. The gate G of the transistor M2 in shift register GOA5 is connected to a first electrode plate E1 of a capacitor C. The first electrode plate E1 of the capacitor C may be connected to relevant structures in GOA5 through a crossover hole Vc to receive a control signal. In some embodiments, as shown in FIG. 12A, the first electrode plate E1 of the capacitor C may be disposed on the same layer as the gate G of the transistor M2. A second electrode plate E2 of the capacitor C may be electrically connected to one of the source S and the drain D of the transistor M2 in the shift register GOA5. For example, as shown in FIG. 12, the second electrode plate E2 of the capacitor C may be disposed on the same layer as the source S and the drain D of the transistor M2 in the shift register GOA5, and be connected to the drain D.

A second end of gate line G6 is connected to the drain D of the transistor M1 of the auxiliary circuit A6 by a wiring W2. For example, a first end of the gate line G6 is connected to the wiring W2 through a crossover hole H2, and connected to the drain D of the transistor M1 of the auxiliary circuit A6. The wiring W1 may include a first part W1_1 extending in the first direction and a second part W1_2 extending in the second direction. The wiring W2 may include a first part W2_1 extending in the first direction and a second part W2_2 extending in the second direction. The first part W1_1 of the wiring W1 is substantially parallel to the first part W2_1 of the wiring W2. The second part of W1_2 of the wiring W1 is substantially parallel to the second part W2_2 of the wiring W2. The second part W1_2 of the wiring W1 is located between the second part W2_2 of the wiring W2 and the display region AA.

In addition, the second end of the gate line G6 is also connected to the gate G of the transistor M1 in the auxiliary circuit A2 through a wiring W3. The drain D of the transistor M1 of the auxiliary circuit A2 is connected to the first end of a gate line G2. For example, the first end of the gate line G6 is connected to the wiring W2 through the crossover hole H2, the wiring W2 is connected to the wiring W3 through a crossover hole H3, and the wiring W3 is connected to the gate G of the transistor M1 in the auxiliary circuit A2. In this way, an electrical connection between the first end of the gate line G6 and the gate G of the transistor M1 in the auxiliary circuit A2 is achieved. It may be seen that in the example in FIGS. 12B and 12C, k=4, that is to say the auxiliary circuit A2 connected to the gate line G2 is controlled by a scanning signal on the gate line G6, an auxiliary circuit A4 connected to a gate line G4 is controlled by a scanning signal on a gate line G8, and so on. In FIG. 12A, the wiring W3 may extend in the second direction, for example, across a transistor M1 in the second direction, and be located between the second part W2_2 of the wiring W2 connected to the transistor M1 and the transistor M1.

In FIG. 12A, the respective source S and the respective drain D of the transistors M1 and M2 are disposed in a comb pattern, and the patterns of the source S and the drain D of each transistor are engaged with each other. However, the embodiments of the present disclosure are not limited to thereto. The sources S and the drains D of transistors M1 and M2 may be disposed in any suitable pattern as required.

In embodiments of the present disclosure, by disposing an auxiliary circuit, the output signal at the far end of the gate line may be pulled down, the falling time of the signal on the entire gate line may be reduced, and especially an effect on the falling time of the signal at the far end is more obvious, so as to reduce the difference in the falling time of the signal between the near end of the gate line and the far end of the gate line, and improve a display uniformity of the entire display panel. The function and effect of the auxiliary circuits will be described below with reference to FIG. 13 to FIG. 17.

FIG. 13 to FIG. 17 show comparison results views of falling times of signals at both ends of a gate line when transistors of different sizes are employed according to embodiments of the present disclosure.

Figures 13, 14, 15:
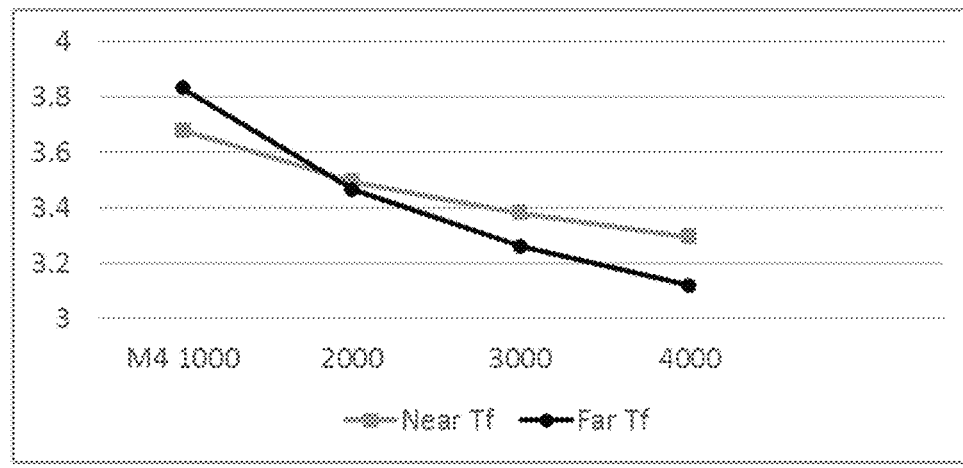
FIG. 13 to FIG. 17 show comparison results of falling times of signals at both ends of a gate line when transistors of different sizes are employed according to embodiments of the present disclosure.

As shown in FIG. 13, compared to a case that no auxiliary circuit (transistor M1) is disposed, a falling time Near Tf of a signal at a near end of the gate line and a falling time Far Tf of a signal at a far end of the gate line are significantly shorter when the auxiliary circuit (transistor M1) is disposed. For example, for a case that a channel width of a transistor M2 is 4900 μm, by disposing the transistor M1 of a channel width of 3200 μm, the falling time of the signal at the near end of the gate line may be reduced from 4.056 μs to 3.361 μs, and the falling time of the signal at the far end of the gate line may be reduced from 4.547 μs to 3.227 μs.

As shown in FIGS. 14 and 15, when the channel width of the transistor M1 is larger, that is the size of the auxiliary circuit is larger, the falling time of the signal at both ends of the gate line are short. For example, for a case that the channel width of the transistor M2 is 4900 μm, when the channel width of the transistor M1 is larger, the falling time Near Tf of the signal at the near end of the gate line and the falling time Far Tf of the signal at the far end of the gate line are short.

Figures 16, 17:
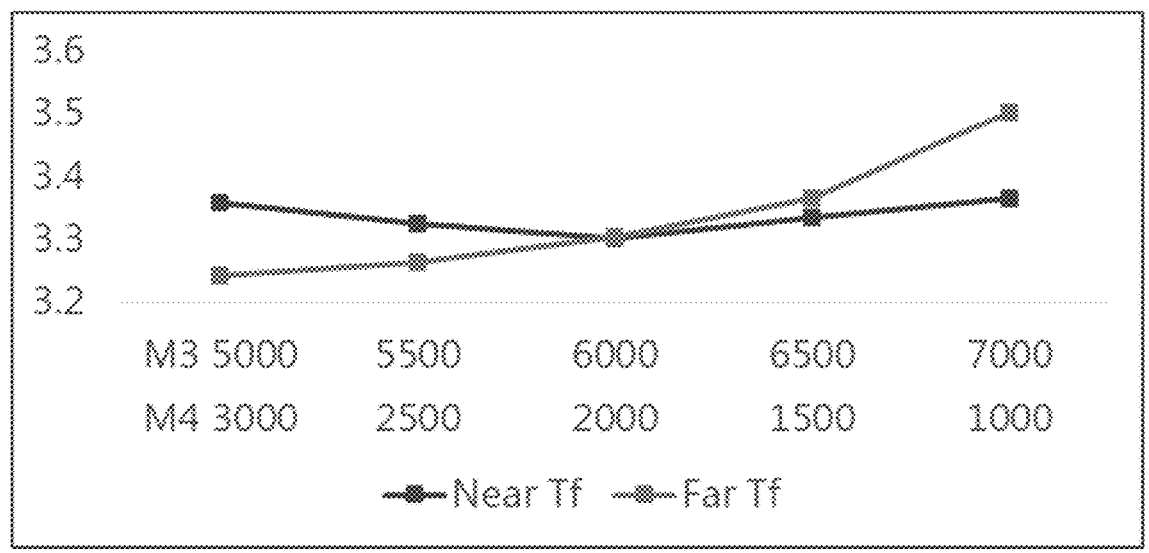

In the embodiments of the present disclosure, since a frame size of the display panel is limited, the space occupied by each transistor is limited. In the embodiments of the present disclosure, the transistor M2 in the shift register plays a major role in signal reduction at the near end of the gate line, and transistor M1 in the auxiliary circuit plays a major role in signal reduction at the far end of the gate line. That is to say, compared to the transistor M1, the transistor M2 has a greater effect on the falling time of the signal at the near end; and compared to M2, the transistor M1 has a greater effect on the falling time of the signal at the far end of the gate line. Therefore, in a limited space, for example, when the total size of the reserved space for the transistors M1 and M2 is fixed, in order to make the overall falling time of the signal at the near end of the gate line and the far end of the gate line smaller and similar, the sizes of the transistors M1 and M2 may be balanced to achieve an optimized allocation of sizes. As shown in FIGS. 16 and 17, when the sum of the channel widths of the transistors M1 and M2 is fixed at 8000 μm, a sequence of the transistor M2 is increased and a sequence of the transistor M1 is decreased. It may be seen from FIGS. 16 and 17 that for the display panels in the above embodiments, the channel width of the transistor M1 may be in a range of 1000 μm to 3000 μm, the channel width of the transistor M2 may be in a range of 5000 μm to 7000 μm, and the channel lengths of the transistors M1 and M2 may be in a range of 3 μm to 6 μm. In some embodiments, a ratio of the channel widths of transistors M1 and M2 may be set to minimize the falling time of the signal of the near end of the gate line and the falling time of the signal of the far end of the gate line and the difference between the near end of the gate line and the far end of the gate line, such as the difference is less than 0.1 us. For example, a ratio of the channel width of the transistor M1 to the channel width of the transistor M2 may be set in a range of 0.23 to 0.45, for example, it may be set to substantially 0.33. It may be seen from FIGS. 16 and 17 that when the channel width of the transistor M2 is about 6000 μm, and the channel width of the transistor M1 is about 2000 μm, the falling time of the signal at the near end of the gate line and the falling time of the signal at far end of the gate line are generally smaller and the difference of the two is minimal.

The embodiment of the present disclosure also provides a display device, including a display panel of any of the aforementioned embodiments. Examples of display devices include but are not limited to various electronic devices with display functions, such as tablets, televisions, mobile phones, and so on.

In some embodiments, there is provided a method of controlling a display panel of any one of the embodiments described above, including respectively providing scanning signals to a plurality of rows of sub-pixels by a plurality of shift registers during a plurality of scanning periods. Each scanning period includes a first period and a second period.

In the first period, at least one shift register among the plurality of shift registers provides a scanning signal to at least one row of sub-pixels among the plurality of sub-pixels through at least one gate line.

In the second period, at least one auxiliary circuit of the plurality of auxiliary circuits provides a reference signal to the gate line under control of an auxiliary signal.

Those of ordinary skill in the art may understand that the embodiments described above are exemplary, and those of ordinary skilled in the art may improve them. The structures described in various embodiments may be freely combined without conflicting with each other in structures or principles.

After describing the preferred embodiments of the present disclosure, those of ordinary skill in the art may clearly understand that various changes may be made without departing from the scope and spirit of the accompanying claims, and the present disclosure is not limited to the implementation methods of the exemplary embodiments cited in the specification.

What is claimed is:

1. A display panel, comprising:
   a base substrate, the base substrate comprising a display region and a peripheral region surrounding the display region;
   a plurality of sub-pixels located in the display region and arranged in a plurality of rows along a first direction;
   a plurality of gate lines located in the display region, wherein the plurality of gate lines extend along the first direction and are arranged along a second direction intersecting with the first direction, and each gate line is connected to at least one row of sub-pixels;

a plurality of shift registers located in the peripheral region and configured to provide scanning signals; and a plurality of auxiliary circuits located in the peripheral region, wherein a first end of at least one gate line is connected to at least one of the plurality of shift registers and configured to receive the scanning signal provided by the at least one of the plurality of shift registers, and a second end of the at least one gate line is connected to at least one of the plurality of auxiliary circuits, wherein a control terminal of each auxiliary circuit is configured to receive an auxiliary signal, an input terminal of each auxiliary circuit is configured to receive a reference signal, an output terminal of each auxiliary circuit is connected to the second end of a respective gate line, and each auxiliary circuit is configured to provide the reference signal at the input terminal of the auxiliary circuit to the output terminal of the auxiliary circuit under control of the auxiliary signal;

wherein:

the plurality of shift registers comprise a plurality of first shift registers, which are located on a first side of the display region along the first direction and are cascaded, and a plurality of second shift registers, which are located on the second side of the display region and are cascaded;

the plurality of auxiliary circuits comprise a plurality of first auxiliary circuits located on a second side of the display region opposite to the first side of the display region along the first direction, and a plurality of second auxiliary circuits located on the first side of the display region;

the at least one gate line comprises a plurality of first gate lines and a plurality of second gate lines alternated with the plurality of first gate lines, a first end of each first gate line is located on the first side of the display region and connected to a respective first shift register, a second end of each first gate line is located on the second side of the display region and connected to a respective first auxiliary circuit, a first end of each second gate line is located on the second side of the display region and connected to a respective second shift register, and a second end of each second gate line is located on the first side of the display region and connected to a respective second auxiliary circuit; and a size of each first auxiliary circuit in the second direction is equal to a sum of sizes of two rows of sub-pixels in the second direction, and a size of each second auxiliary circuit in the second direction is equal to the sum of sizes of two rows of sub-pixels in the second direction.

2. The display panel of claim 1, wherein the control terminal of the auxiliary circuit connected to an $i^{th}$ gate line among the plurality of gate lines is connected to receive, as the auxiliary signal, the scanning signal provided by the shift register connected to an $(i+k)^{th}$ gate line, where each of $i^{th}$ and k is an integer greater than or equal to 1.

3. The display panel of claim 1, wherein a control terminal of an $i^{th}$ auxiliary circuit is connected to a second end of an $(i+k)^{th}$ gate line, and an output terminal of the $i^{th}$ auxiliary circuit is connected to a second end of an $i^{th}$ gate line.

4. The display panel of claim 1, wherein each first gate line is connected to an odd numbered row of sub-pixels, and each second gate line is connected to an even numbered row of sub-pixels.

5. The display panel of claim 1, wherein:

k=4; and a control terminal of an $i^{th}$ auxiliary circuit is connected to a second end of an $(i+4)^{th}$ gate line, and an output terminal of the $i^{th}$ auxiliary circuit is connected to a second end of an $i^{th}$ gate line.

6. The display panel of claim 1, wherein the first auxiliary circuit is located between the display region and the second shift register, and the second auxiliary circuit is located between the display region and the first shift register.

7. The display panel of claim 1, wherein each auxiliary circuit comprises a first transistor, wherein a gate of the first transistor is implemented as the control terminal of the auxiliary circuit, a first electrode of the first transistor is implemented as the input terminal of the auxiliary circuit, and a second electrode of the first transistor is implemented as the output terminal of the auxiliary circuit.

8. The display panel of claim 1, wherein each shift register comprises:

an input circuit connected to an input signal terminal of the shift register and a pull-up node of the shift register, and configured to provide a signal from the input signal terminal to the pull-up node;

an output circuit connected to the pull-up node, a clock signal terminal of the shift register and an output signal terminal of the shift register, and configured to provide a signal from the clock signal terminal to the output signal terminal under control of the pull-up node, so as to output the scanning signal;

a control circuit connected to the pull-up node of the shift register and a pull-down node of the shift register, and configured to control a potential of the pull-down node based on a potential of the pull-up node; and a pull-down circuit connected to the output signal terminal of the shift register and the pull-down node, and configured to pull down a potential of the output signal terminal of the shift register under control of the pull-down node.

9. The display panel of claim 8, wherein the output circuit comprises:

a second transistor, wherein a gate of the second transistor is connected to the pull-up node, a first electrode of the second transistor is connected to the clock signal terminal, and a second electrode of the second transistor is connected to the output signal terminal of the shift register; and a capacitor, wherein a first electrode of the capacitor is connected to the pull-up node, and a second electrode of the capacitor is connected to the output signal terminal of the shift register.

10. The display panel of claim 9, wherein each auxiliary circuit comprises a first transistor, wherein a gate of the first transistor is implemented as the control terminal of the auxiliary circuit, a first electrode of the first transistor is implemented as the input terminal of the auxiliary circuit, and a second electrode of the first transistor is implemented as the output terminal of the auxiliary circuit; and wherein the first transistor is a thin film transistor, a channel width of the first transistor is in a range of 1000 µm to 3000 µm, the second transistor is a thin film transistor, a channel width of the second transistor is in a range of 5000 µm to 7000 µm, and a channel length of each of the first transistor and the second transistor is in a range of 3 µm to 6 µm.

11. The display panel of claim 8, wherein each shift register further comprises a reset circuit, wherein the reset circuit is connected to the pull-up node and a reset signal terminal of the shift register, and configured to reset the pull-up node under control of the reset signal terminal.

12. A display device comprising a display panel of claim 1.

13. A method of controlling a display panel, the display panel comprising: a base substrate, the base substrate comprising a display region and a peripheral region surrounding the display region; a plurality of sub-pixels located in the display region and arranged in a plurality of rows along a first direction; a plurality of gate lines located in the display region, wherein the plurality of gate lines extend along the first direction and are arranged along a second direction intersecting with the first direction, and each gate line is connected to at least one row of sub-pixels; a plurality of shift registers located in the peripheral region and configured to provide scanning signals; and a plurality of auxiliary circuits located in the peripheral region, wherein a first end of at least one gate line is connected to at least one of the plurality of shift registers and configured to receive the scanning signal provided by the at least one of the plurality of shift registers, and a second end of the at least one gate line is connected to at least one of the plurality of auxiliary circuits, wherein a control terminal of each auxiliary circuit is configured to receive an auxiliary signal, an input terminal of each auxiliary circuit is configured to receive a reference signal, an output terminal of each auxiliary circuit is connected to the second end of a respective gate line, and each auxiliary circuit is configured to provide the reference signal at the input terminal of the auxiliary circuit to the output terminal of the auxiliary circuit under control of the auxiliary signal, wherein:
the plurality of shift registers comprise a plurality of first shift registers, which are located on a first side of the display region along the first direction and are cascaded, and a plurality of second shift registers, which are located on the second side of the display region and are cascaded:
the plurality of auxiliary circuits comprise a plurality of first auxiliary circuits located on a second side of the display region opposite to the first side of the display region along the first direction, and a plurality of second auxiliary circuits located on the first side of the display region:
the at least one gate line comprises a plurality of first gate lines and a plurality of second gate lines alternated with the plurality of first gate lines, a first end of each first gate line is located on the first side of the display region and connected to a respective first shift register, a second end of each first gate line is located on the second side of the display region and connected to a respective first auxiliary circuit, a first end of each second gate line is located on the second side of the display region and connected to a respective second shift register, and a second end of each second gate line is located on the first side of the display region and connected to a respective second auxiliary circuit; and
a size of each first auxiliary circuit in the second direction is equal to a sum of sizes of two rows of sub-pixels in the second direction, and a size of each second auxiliary circuit in the second direction is equal to the sum of sizes of two rows of sub-pixels in the second direction; and
wherein the method comprises respectively providing scanning signals to a plurality of rows of sub-pixels by a plurality of shift registers during a plurality of scanning periods, wherein each scanning period comprises a first period and a second period, wherein:
in the first period, at least one of the plurality of shift registers provides a scanning signal to at least one row of sub-pixels among the plurality of sub-pixels through at least one gate line; and
in the second period, at least one of the plurality of auxiliary circuits provides a reference signal to the at least one gate line under control of an auxiliary signal.

14. A display panel, comprising:
a base substrate, the base substrate comprising a display region and a peripheral region surrounding the display region;
a plurality of sub-pixels located in the display region and arranged in a plurality of rows along a first direction;
a plurality of gate lines located in the display region, wherein the plurality of gate lines extend along the first direction and are arranged along a second direction intersecting with the first direction, and each gate line is connected to at least one row of sub-pixels;
a plurality of shift registers located in the peripheral region and configured to provide scanning signals; and
a plurality of auxiliary circuits located in the peripheral region, wherein a first end of at least one gate line is connected to at least one of the plurality of shift registers and configured to receive the scanning signal provided by the at least one of the plurality of shift registers, and a second end of the at least one gate line is connected to at least one of the plurality of auxiliary circuits, wherein a control terminal of each auxiliary circuit is configured to receive an auxiliary signal, an input terminal of each auxiliary circuit is configured to receive a reference signal, an output terminal of each auxiliary circuit is connected to the second end of a respective gate line, and each auxiliary circuit is configured to provide the reference signal at the input terminal of the auxiliary circuit to the output terminal of the auxiliary circuit under control of the auxiliary signal,
wherein the plurality of shift registers comprise a plurality of first shift registers which are located on a first side of the display region along the first direction and are cascaded, and a plurality of second shift registers located on a second side of the display region opposite to the first side of the display region along the first direction;
wherein the plurality of auxiliary circuits comprise a plurality of first auxiliary circuits located on a second side of the display region and a plurality of second auxiliary circuits located on the first side of the display region; and
wherein each of the plurality of gate lines has a first end located on the first side of the display region and connected to a respective first shift register and a respective second auxiliary circuit, and a second end located on the second side of the display region and connected to a respective first auxiliary circuit and a respective second shift register.

15. The display panel of claim 14, wherein each first auxiliary circuit is located between the display region and a respective second shift register, and each second auxiliary circuit is located between the display region and a respective first shift register.

16. The display panel of claim 14, wherein:
a control terminal of an $i^{th}$ first auxiliary circuit is connected to an output signal terminal of an $(i+k)^{th}$ stage of second shift register, and an output terminal of an $i^{th}$ first auxiliary circuit is connected to a second end of an $i^{th}$ first gate line; and a control terminal of an $i^{th}$ second auxiliary circuit is connected to an output signal terminal of an $(i+k)^{th}$ stage of first shift register, and an output terminal of the $i^{th}$ second auxiliary circuit is connected to a first end of the $i^{th}$ first gate line.

* * * * *